(12) United States Patent
Cheng et al.

(10) Patent No.: US 9,704,859 B1
(45) Date of Patent: Jul. 11, 2017

(54) FORMING SEMICONDUCTOR FINS WITH SELF-ALIGNED PATTERNING

(71) Applicant: INTERNATIONAL BUSINESS MACHINES CORPORATION, Armonk, NY (US)

(72) Inventors: Kangguo Cheng, Schenectady, NY (US); Fee Li Lie, Albany, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/148,052

(22) Filed: May 6, 2016

(51) Int. Cl.
*H01L 27/088* (2006.01)
*H01L 21/8234* (2006.01)
*H01L 21/762* (2006.01)
*H01L 29/66* (2006.01)
*H01L 29/06* (2006.01)
*H01L 21/308* (2006.01)
*H01L 29/51* (2006.01)

(52) U.S. Cl.
CPC ...... *H01L 27/0886* (2013.01); *H01L 21/3081* (2013.01); *H01L 21/76224* (2013.01); *H01L 21/823431* (2013.01); *H01L 21/823481* (2013.01); *H01L 29/0649* (2013.01); *H01L 29/517* (2013.01); *H01L 29/518* (2013.01); *H01L 29/6653* (2013.01); *H01L 29/66545* (2013.01)

(58) Field of Classification Search
CPC ......... H01L 27/0886; H01L 21/823431; H01L 21/823481; H01L 21/76224; H01L 29/0649; H01L 21/3081; H01L 29/66545; H01L 29/6653
See application file for complete search history.

(56) References Cited

U.S. PATENT DOCUMENTS

| 8,269,283 | B2 | 9/2012 | Cea et al. |
| 8,815,668 | B2 | 8/2014 | Basker et al. |
| 8,987,100 | B2 * | 3/2015 | Oh .................... H01L 29/66477 257/E21.002 |
| 8,987,836 | B2 * | 3/2015 | Kim ..................... H01L 29/785 257/288 |
| 9,236,267 | B2 | 1/2016 | De et al. |

(Continued)

FOREIGN PATENT DOCUMENTS

EP 1202335 A2 5/2002

OTHER PUBLICATIONS

Kangguo Cheng, et al., "Forming Semiconductor Fins With Self-Aligned Patterning", U.S. Appl. No. 15/173,803, filed Jun. 6, 2016.

(Continued)

*Primary Examiner* — David Vu
(74) *Attorney, Agent, or Firm* — Cantor Colburn LLP; Vazken Alexanian

(57) ABSTRACT

A method for fabricating a semiconductor device comprises removing a portion of a substrate to form a first cavity in the substrate and depositing an insulator material in the first cavity. A sacrificial pattern is formed on a portion of the insulator material in the first cavity and the substrate. Exposed portions of the substrate are removed to form a fin in the substrate. A gate stack is formed over a portion of the fin.

11 Claims, 26 Drawing Sheets

(56) References Cited

U.S. PATENT DOCUMENTS

| | | |
|---|---|---|
| 9,263,325 B1 | 2/2016 | Wei et al. |
| 2014/0083972 A1 | 3/2014 | Oyama et al. |
| 2015/0035081 A1 | 2/2015 | Cheng et al. |
| 2015/0108551 A1 | 4/2015 | Shieh et al. |
| 2015/0243509 A1 | 8/2015 | Chan et al. |
| 2015/0243667 A1 | 8/2015 | Liaw |
| 2015/0287595 A1 | 10/2015 | Wei et al. |

OTHER PUBLICATIONS

Kangguo Cheng, et al., "Forming Semiconductor Fins With Self-Aligned Patterning", U.S. Appl. No. 15/173,804, filed Jun. 6, 2016.
List of IBM Patents or Patent Applications Treated as Related; (Appendix P), Filed Jun. 14, 2016, 2 pages.

\* cited by examiner

FORMING SEMICONDUCTOR FINS WITH SELF-ALIGNED PATTERNING

BACKGROUND

The present invention generally relates to complimentary metal-oxide semiconductors (CMOS) and metal-oxide-semiconductor field-effect transistors (MOSFET), and more specifically, to finFET device fabrication.

The MOSFET is a transistor used for switching electronic signals. The MOSFET has a source, a drain and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET includes n-doped source and drain junctions, and uses electrons as the current carriers. The pFET includes p-doped source and drain junctions, and uses holes as the current carriers.

The finFET is a type of MOSFET. The finFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the lithography irradiation.

SUMMARY

According to an embodiment of the present invention, a method for fabricating a semiconductor device comprises removing a portion of a substrate to form a first cavity in the substrate and depositing an insulator material in the first cavity. A sacrificial pattern is formed on a portion of the insulator material in the first cavity and the substrate. Exposed portions of the substrate are removed to form a fin in the substrate. A gate stack is formed over a portion of the fin.

According to another embodiment of the present invention, a method for fabricating a semiconductor device includes forming a first sacrificial layer over a substrate and removing a portion of the first sacrificial layer and the substrate to form a first cavity in the substrate and the first sacrificial layer. An insulator material is deposited in the first cavity. A sacrificial pattern is formed on a portion of the insulator material and the substrate. The first sacrificial layer and exposed portions of the substrate are removed to form a fin in the substrate. A gate stack is formed over a portion of the fin.

According to yet another embodiment of the present invention, a semiconductor device comprises a semiconductor fin arranged on a substrate and a trench isolation region arranged adjacent to the semiconductor fin. A liner layer is arranged in the trench isolation region and a first layer of insulator material arranged on the liner layer. A gate stack is arranged over a channel region of the semiconductor fin.

According to yet another embodiment of the present invention, a method for fabricating a semiconductor device comprises removing a portion of a substrate to form a first cavity in the substrate and depositing an insulator material in the first cavity. A sacrificial mandrel is formed on the substrate and the insulator material. The insulator material and a portion of the sacrificial mandrel are removed to expose the first cavity. A sacrificial spacer is deposited along sidewalls of the sacrificial mandrel and sidewalls of the first cavity. The sacrificial mandrel and exposed portions of the substrate are removed to form a fin. An insulator material is deposited in the first cavity. A gate stack is formed over a channel region of the fin.

According to yet another embodiment of the present invention, a semiconductor device comprises a semiconductor fin arranged on a substrate and a trench isolation region arranged adjacent to the semiconductor fin, the trench isolation region having a first depth and a second depth, where the first depth is greater than the second depth. A liner layer is arranged in the trench isolation region, and a first layer of insulator material is arranged on the liner layer. A gate stack is arranged over a channel region of the semiconductor fin.

BRIEF DESCRIPTION OF THE DRAWINGS

FIG. 1 illustrates a side view of a substrate and a hardmask arranged on the substrate.

FIG. 2 illustrates a side view following the formation of trenches.

FIG. 3 illustrates a cut-away view along the line A-A (of FIG. 4) following the formation of shallow trench isolation regions.

FIG. 4 illustrates a top view of the hardmask and the shallow trench isolation regions.

FIG. 5 illustrates a side view following the formation of a first sacrificial layer over exposed portions of the hardmask and the shallow trench isolation regions and a second sacrificial layer that is formed over the first sacrificial layer.

FIG. 6 illustrates a side view following the patterning and removal of portions of the second sacrificial layer.

FIG. 7 illustrates a cut-away view along the line A-A (of FIG. 8) following the formation of a sacrificial spacer around sidewalls of the first sacrificial mandrel.

FIG. 8 illustrates a top view of the first sacrificial mandrel arranged on the first sacrificial layer and the sacrificial spacer arranged along sidewalls of the first sacrificial mandrel.

FIG. 9 illustrates a cut-away view along the line A-A (of FIG. 10) following a selective anisotropic etching process.

FIG. 10 illustrates a top view of the sacrificial spacer arranged on the hardmask and the shallow trench isolation regions.

FIG. 11 illustrates a cut-away view along the line A-A (of FIG. 12) following the removal of the sacrificial spacer and the formation of second sacrificial spacers.

FIG. 12 illustrates a top view of the second sacrificial spacers arranged along the sidewalls of the second sacrificial mandrel.

FIG. 13 illustrates a cut-away view along the line A-A (of FIG. 14) following a selective etching process that removes exposed portions of the second sacrificial mandrel.

FIG. 14 illustrates a top view of the second sacrificial spacers arranged on the hardmask and portions of the shallow trench isolation regions.

FIG. 15 illustrates a cut-away view along the line A-A (of FIG. 18) following a selective isotropic etching process.

FIG. 16 illustrates a cut-away view along the line B-B (of FIG. 18) that shows the fins that have been formed following the removal of portions of the substrate.

FIG. 17 illustrates a cut-away view along the line C-C (of FIG. 18).

FIG. 18 illustrates a top view of the substrate, the shallow trench isolation regions and the second sacrificial spacers.

FIG. 19 illustrates a cut-away view following the removal of the shallow trench isolation regions (of FIG. 18).

FIG. 20 illustrates a cut-away view of the fins following the deposition of the liner layer.

FIG. 21 illustrates another cut-away view of the fin following the deposition of the liner layer.

FIG. 22 illustrates a cut-away view parallel to the longitudinal axis if the fins;

FIG. 23 illustrates a cut-away view perpendicular to the fin; and

FIG. 24 illustrates a cut-away view through the fin along the longitudinal axis of the fin following the deposition of an insulator layer that forms a shallow trench isolation region over the liner layer.

FIG. 25 illustrates a cut-away view perpendicular to the fins following the removal of the hardmask using a suitable process.

FIG. 26 illustrates a cut-away view parallel to the longitudinal axis if the fins.

FIG. 27 illustrates a cut-away view perpendicular to the fins; and

FIG. 28 illustrates a cut-away view through the fin along the longitudinal axis of the fins following the deposition of the second layer of insulator material.

FIG. 29 illustrates a cut-away view along the line A-A (of FIG. 30) following the removal of the hardmask.

FIG. 30 illustrates a top view following the removal of the hardmask.

FIG. 31 illustrates a top view following the formation of a sacrificial gate and spacers adjacent to the sacrificial gate.

FIG. 32 illustrates a top view following the formation of source/drain regions.

FIG. 33 illustrates a top view following the removal of the sacrificial gate.

FIG. 34 illustrates a top view of the resultant structure following the formation of a replacement metal gate stack (gate stack).

FIG. 35 illustrates a cut-away view along the line A-A (of FIG. 34) of the gate stack.

FIG. 36 illustrates a side view of the substrate, the hardmask arranged on the substrate.

FIG. 37 illustrates a side view following a lithographic patterning and etching process.

FIG. 38 illustrates a side view following the formation of shallow trench isolation regions in the cavities.

FIG. 39 illustrates a side view following the formation of a second sacrificial layer.

FIG. 40 illustrates a cut-away view along the line A-A (of FIG. 41) following a lithographic patterning and etching process.

FIG. 41 illustrates a top view of the first mandrel and the first sacrificial spacer arranged on the shallow trench isolation region and the first sacrificial layer.

FIG. 42 illustrates a top view of the resultant structure following the formation of second sacrificial spacers and fins.

FIG. 43 illustrates a top view following the removal of the second sacrificial spacers (of FIG. 42) that exposes the fins and the formation of a gate stack.

FIG. 44 illustrates a top view of a sacrificial spacer arranged on a second sacrificial mandrel and trench isolation regions.

FIG. 45 illustrates a cut-away view along the line C-C (of FIG. 46) following a selective etching process.

FIG. 46 illustrates a top view of the sacrificial spacer.

FIG. 47 illustrates a cut-away view along the line A-A (of FIG. 48) following the deposition of the second sacrificial spacers.

FIG. 48 illustrates a top view of the second sacrificial spacer.

FIG. 49 illustrates a cut-away view along the line A-A (of FIG. 52) following an anisotropic etching process.

FIG. 50 illustrates a cut-away view along the line B-B (of FIG. 52) of the fins.

FIG. 51 illustrates a cut-away view along the line C-C (of FIG. 52) of the fins.

FIG. 52 illustrates a top view of the fins arranged on the substrate.

FIG. 53 illustrates a cut-away view similar of the fin following the deposition of a liner layer.

FIG. 54 illustrates a cut-away view of the fin following the removal of the hardmask and the deposition of an insulator material.

DETAILED DESCRIPTION

Previous methods for fabricating finFET devices included forming the fins and then performing a "fin cut" etch that shortens the length dimensions of some of the fins to a desired length. Following the fin cut etch, a liner layer was deposited that substantially prevented the undesired lateral etching of adjacent fins when sacrificial fins are removed.

As the fin pitch continues to decrease, the space between fins is also reduced. The use of the liner layer prior to forming the shallow trench isolation regions reduces the space available for forming a shallow trench isolation region between the distal ends of the cut fins. The liner layer reduces the size of the openings of the isolation trenches, which may cause voids to form in the shallow trench isolation regions when the insulator material is deposited in the trenches.

The present disclosure provides fabrication method and resulting structures, wherein finFET device are formed using a sidewall image transfer process that forms fins following the formation of a trench isolation region. The disclosed methods avoid forming undesired additional fin end liners.

The disclosed methods form trench isolation regions without voids that may be caused by liner layers formed during the sidewall image transfer process.

Turning now to a more detailed description of one or more embodiments, FIGS. 1-25 illustrate an exemplary method for forming fins of a finFET device.

Figure 1:
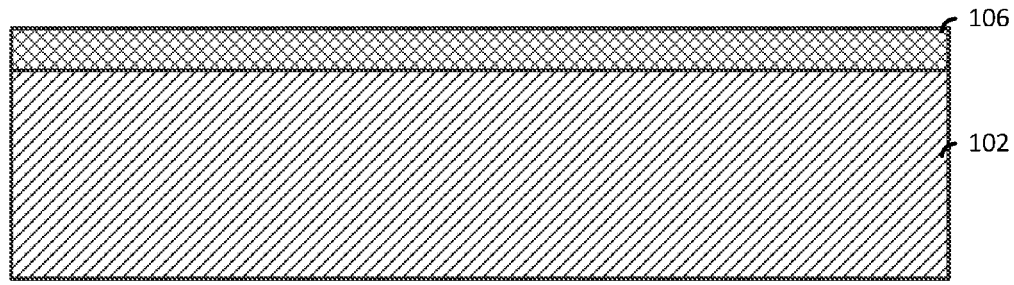
FIGS. 1-25 illustrate an exemplary method for forming fins of a finFET device.

FIG. 1 illustrates a side view of a substrate 102 and a hardmask 106 arranged on the substrate 102. The hardmask 106 may include, in some embodiments, a pad oxide layer (not shown) arranged on the substrate 102. The substrate 102 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 102 may also comprise an organic semiconductor or a layered semiconductor such as, for example, Si/SiGe, a silicon-on-insulator or a SiGe-on-insulator. A portion or entire semiconductor substrate 102 may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate 102 may be doped, undoped or contain doped regions and undoped regions therein. The semiconductor substrate may contain regions with strain and regions without strain therein, or contain regions of tensile strain and compressive strain.

Non-limiting examples of oxides that may form a pad oxide layer include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

The hardmask layer 106 may include, for example, silicon oxide, silicon nitride (SiN), SiOCN, SiBCN or any suitable combination of those. The hardmask layer 106 may be deposited using a deposition process, including, but not limited to, PVD, CVD, PECVD, or any combination thereof.

Figure 2:
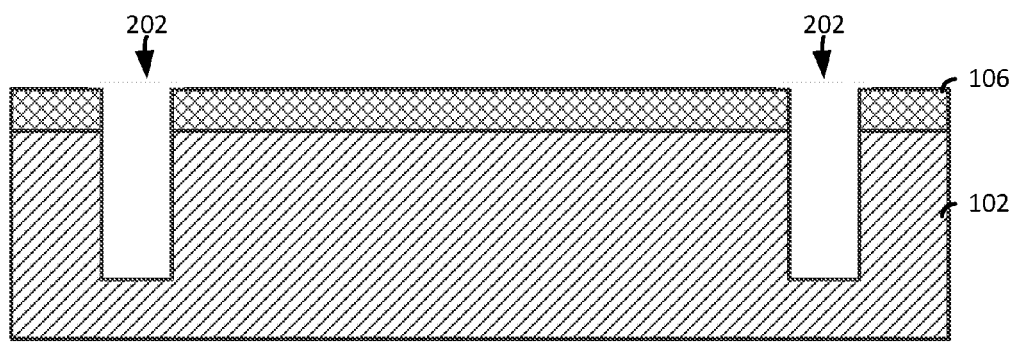

FIG. 2 illustrates a side view following the formation of trenches 202. The trenches 202 may be formed by, for example, a lithographic patterning and etching process such as reactive ion etching that removes exposed portions of the hardmask layer 106 and the substrate 102 to form the trenches 202.

Figure 3:
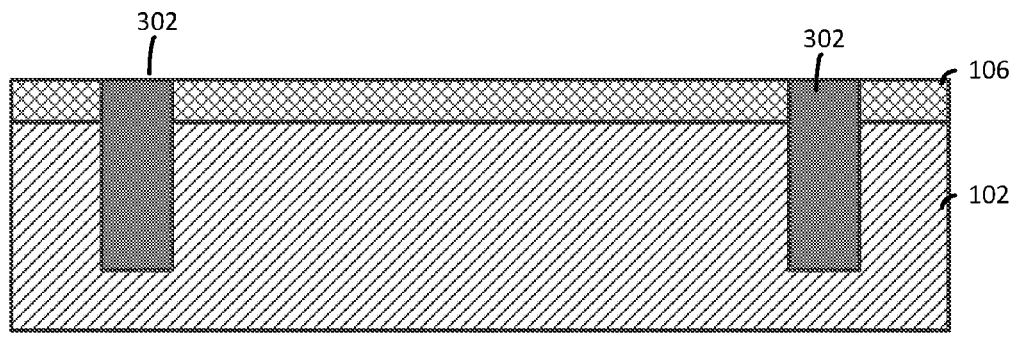

FIG. 3 illustrates a cut-away view along the line A-A (of FIG. 4) following the formation of shallow trench isolation regions 302. The shallow trench isolation regions 302 are formed by filling the trenches 202 (of FIG. 2) with an insulator material such as, for example, an oxide material and performing a planarizing process such as chemical mechanical polishing that removes overburden insulating material to define the shallow trench isolation regions 302.

Figure 4:
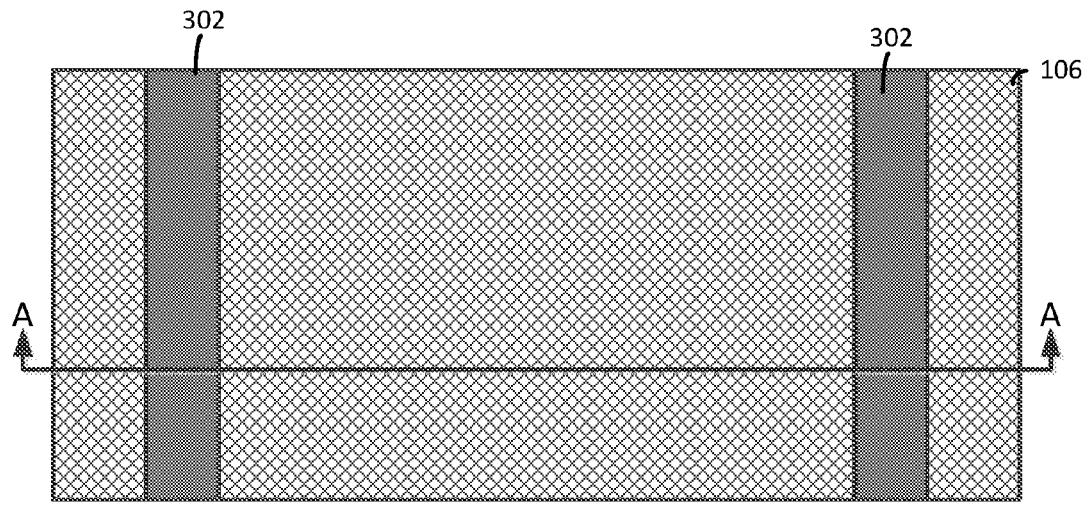

FIG. 4 illustrates a top view of the hardmask 106 and the shallow trench isolation regions 302.

Figure 5:
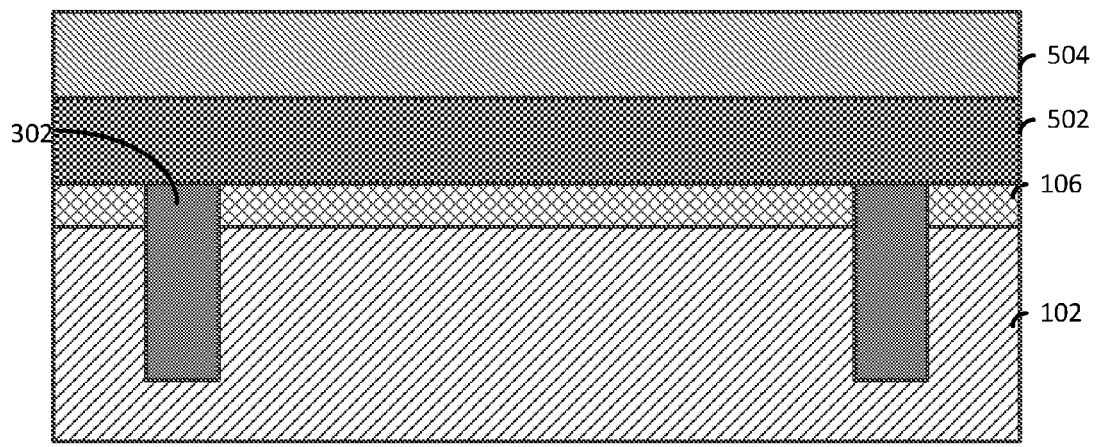

FIG. 5 illustrates a side view following the formation of a first sacrificial layer 502 over exposed portions of the hardmask 106 and the shallow trench isolation regions 302 and a second sacrificial layer 504 that is formed over the first sacrificial layer 502. In the illustrated embodiment, the first sacrificial layer 502 includes an amorphous silicon material and the second sacrificial layer 504 includes an amorphous carbon material.

Figure 6:
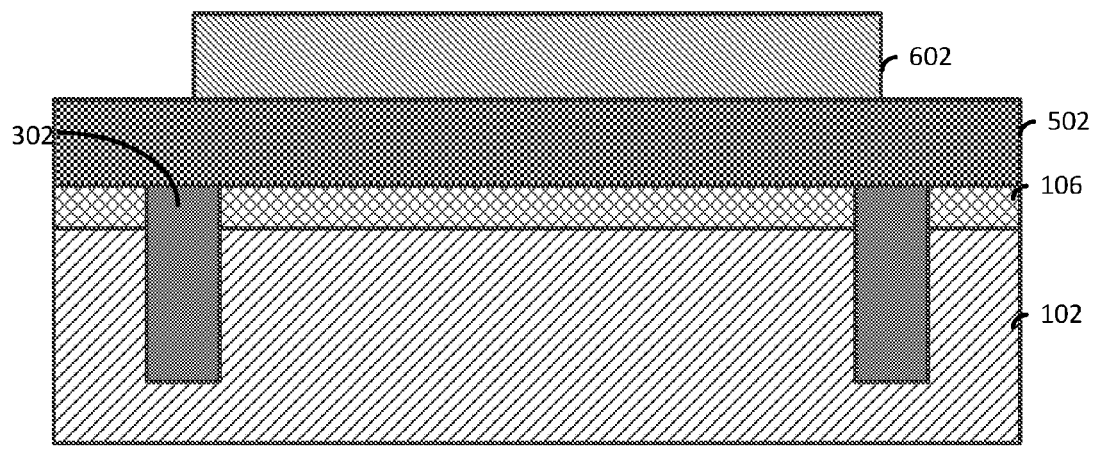

FIG. 6 illustrates a side view following the patterning and removal of portions of the second sacrificial layer 504 that exposes portions of the first sacrificial layer 502 to form a first sacrificial mandrel 602. The first sacrificial mandrel 602 may be formed by, for example, a photolithographic patterning and etching process such as reactive ion etching.

Figure 7:
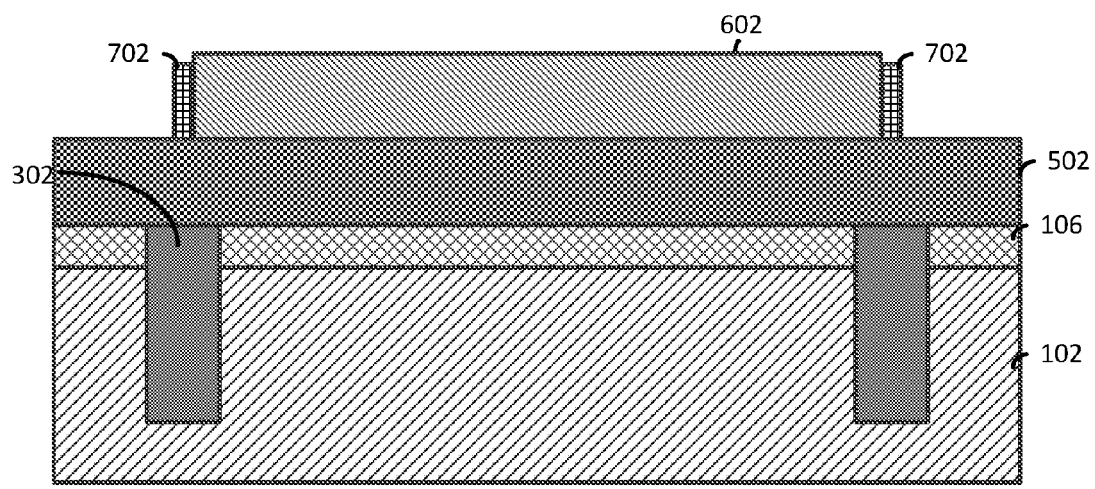

FIG. 7 illustrates a cut-away view along the line A-A (of FIG. 8) following the formation of a sacrificial spacer 702 around sidewalls of the first sacrificial mandrel 602. The sacrificial spacer 702 in the illustrated embodiment includes an oxide material. Alternate embodiments may include sacrificial spacer 702 formed from a nitride, or carbon material, or other suitable materials. The sacrificial spacer 702 is formed by, for example, depositing a layer of sacrificial material (not shown) over the first sacrificial mandrel 602 and the first sacrificial layer 502 and performing a selective etching process that removes portions of the layer of sacrificial material to form the sacrificial spacer 702.

Figure 8:
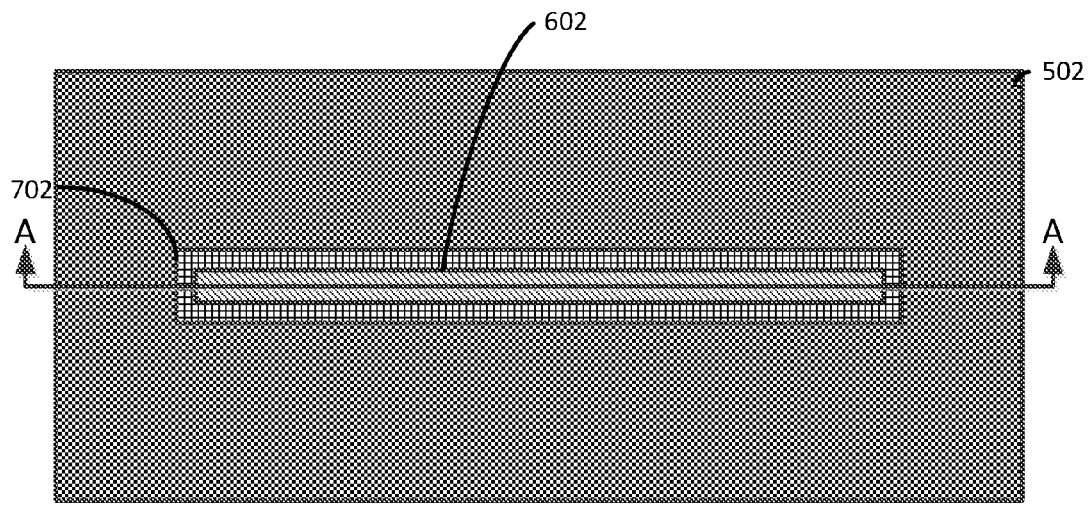

FIG. 8 illustrates a top view of the first sacrificial mandrel 602 arranged on the first sacrificial layer 502 and the sacrificial spacer 702 arranged along sidewalls of the first sacrificial mandrel 602.

Figure 9:
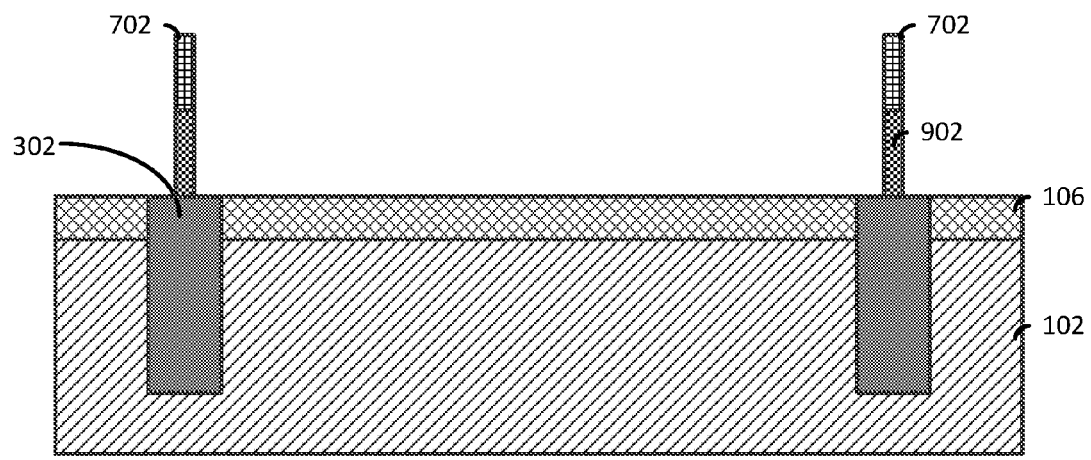

FIG. 9 illustrates a cut-away view along the line A-A (of FIG. 10) following a selective anisotropic etching process that removes exposed portions of the first sacrificial mandrel 602 (of FIG. 8) and removes exposed portions of the first sacrificial layer 502 (of FIG. 8) to form a second sacrificial mandrel 902 that is arranged on portions of the hardmask layer 106 and the shallow trench isolation regions (isolation regions) 302.

Figure 10:
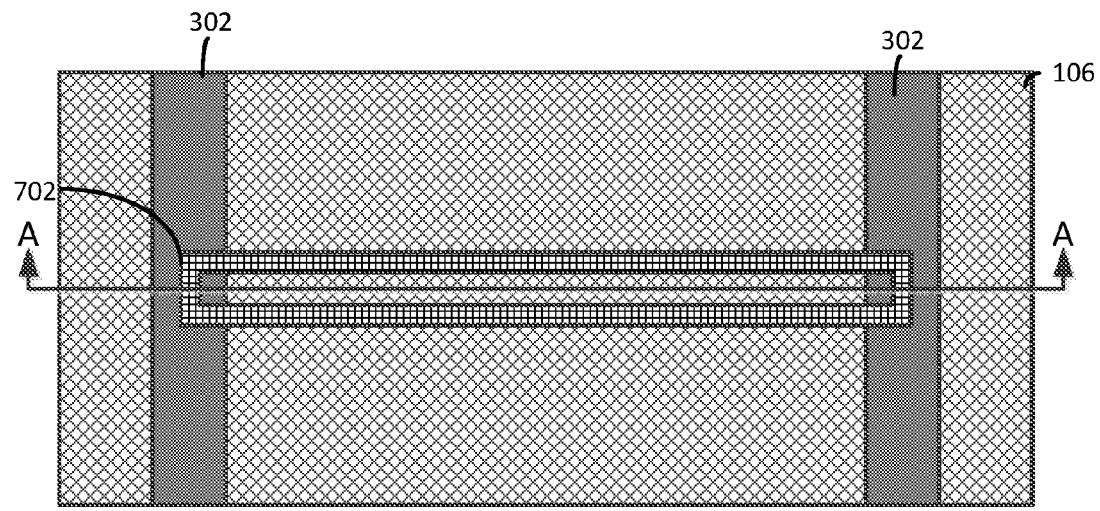

FIG. 10 illustrates a top view of the sacrificial spacer 702 arranged on the hardmask 106 and the shallow trench isolation regions 302.

Figure 11:
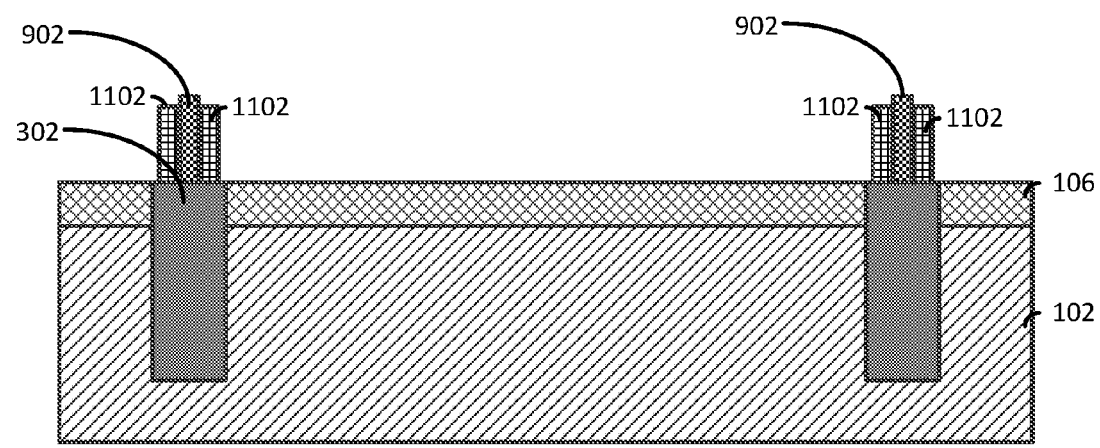

FIG. 11 illustrates a cut-away view along the line A-A (of FIG. 12) following the removal of the sacrificial spacer 702 and the formation of second sacrificial spacers 1102. Following the removal of the sacrificial spacer 702, the second sacrificial spacers 1102 are formed along sidewalls of the second sacrificial mandrel 902 on portions of the hardmask 106 and the shallow trench isolation regions 302. The second sacrificial spacers 1102 may be formed using a similar process as described above to form the sacrificial spacers 702 (of FIG. 7).

Figure 12:
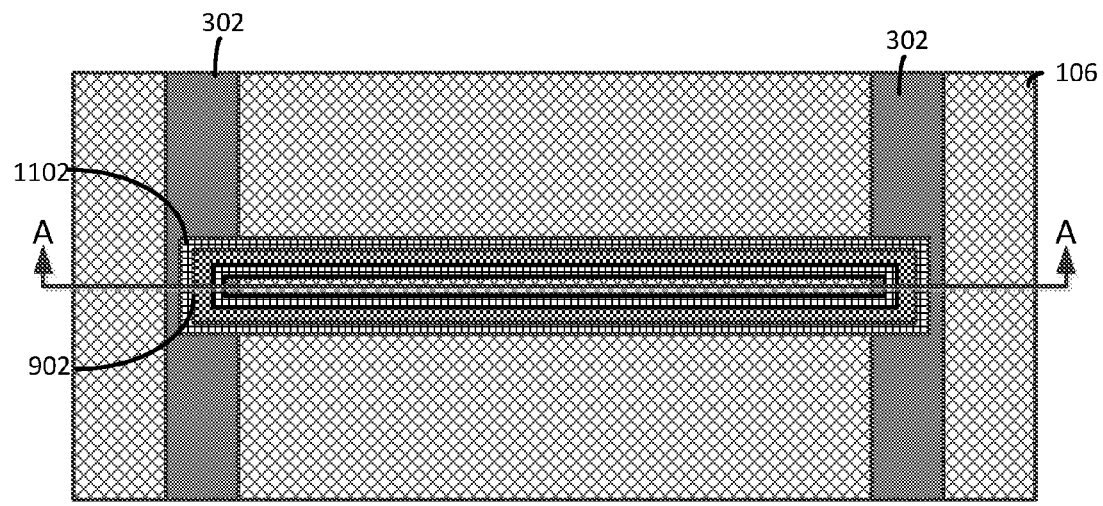

FIG. 12 illustrates a top view of the second sacrificial spacers 1102 arranged along the sidewalls of the second sacrificial mandrel 902.

Figure 13:
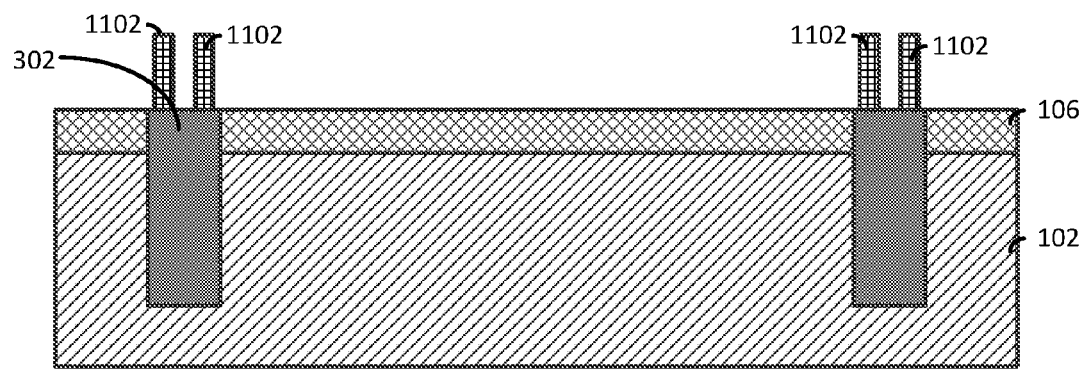

FIG. 13 illustrates a cut-away view along the line A-A (of FIG. 14) following a selective etching process that removes exposed portions of the second sacrificial mandrel 902 (of FIG. 12).

Figure 14:
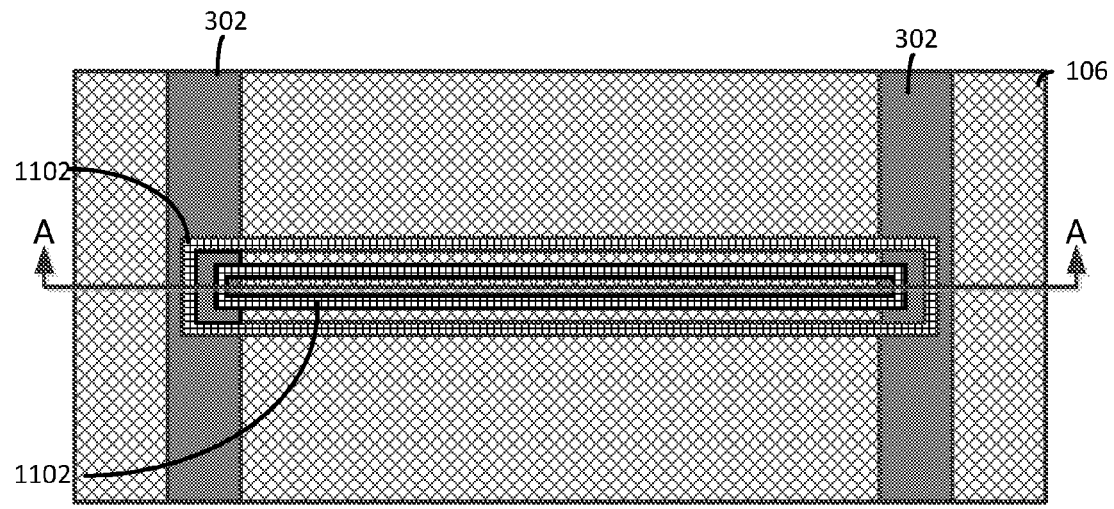

FIG. 14 illustrates a top view of the second sacrificial spacers 1102 arranged on the hardmask 106 and portions of the shallow trench isolation regions 302.

Figure 15:
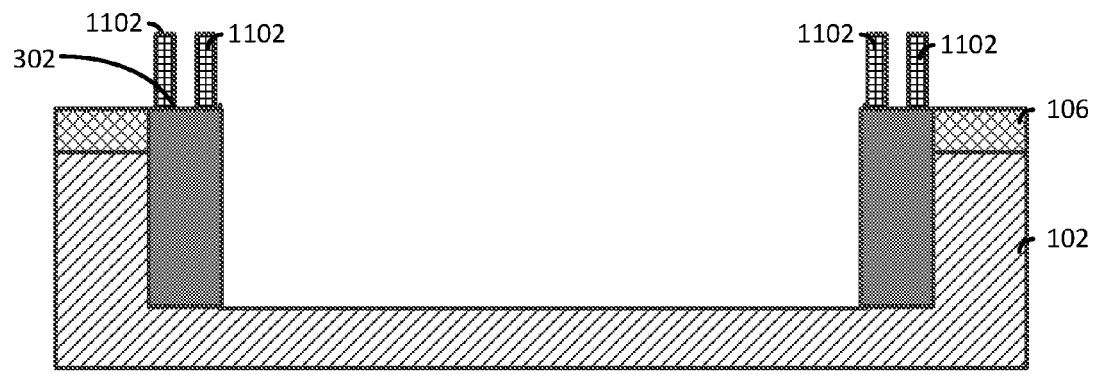

FIG. 15 illustrates a cut-away view along the line A-A (of FIG. 18) following a selective isotropic etching process such as, for example, reactive ion etching. The etching process removes exposed portions of the hardmask 106 and the substrate 102 to form fins (described below). The selective etching process in the illustrated exemplary embodiment does not substantially remove portions of the shallow trench isolation region 302.

Figure 16:
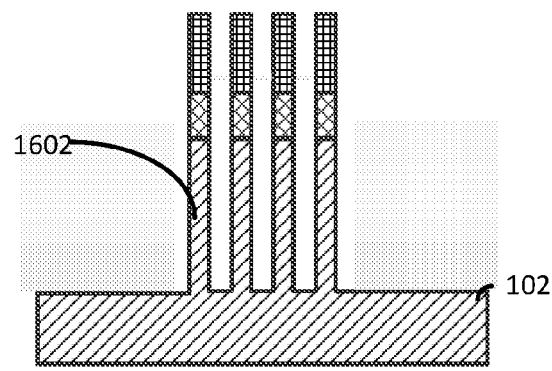
Figure 18:
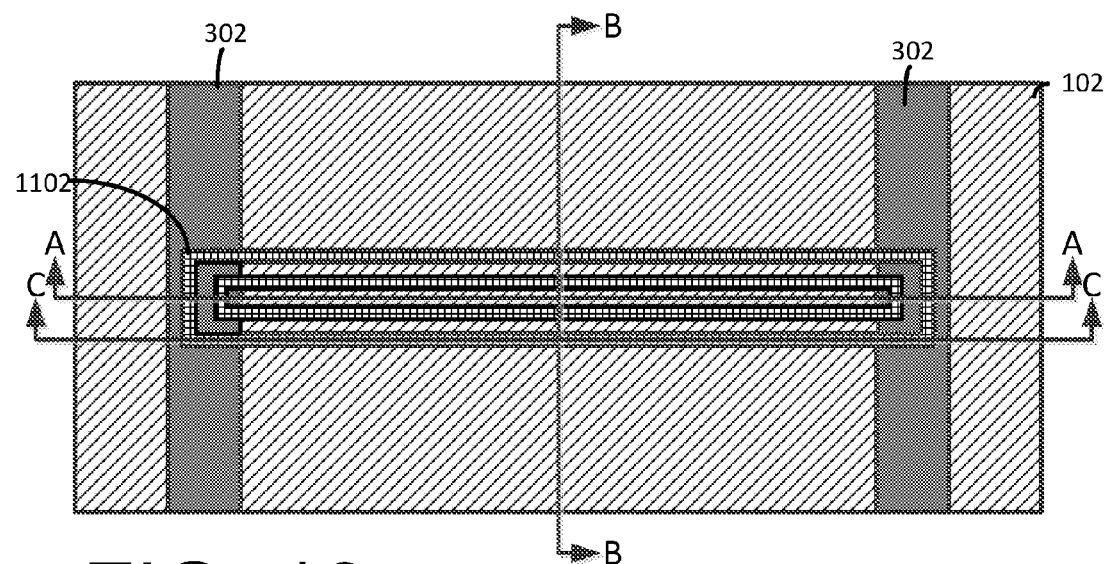

FIG. 16 illustrates a cut-away view along the line B-B (of FIG. 18). FIG. 16 shows the fins 1602 that have been formed following the removal of portions of the substrate 102.

Figure 17:
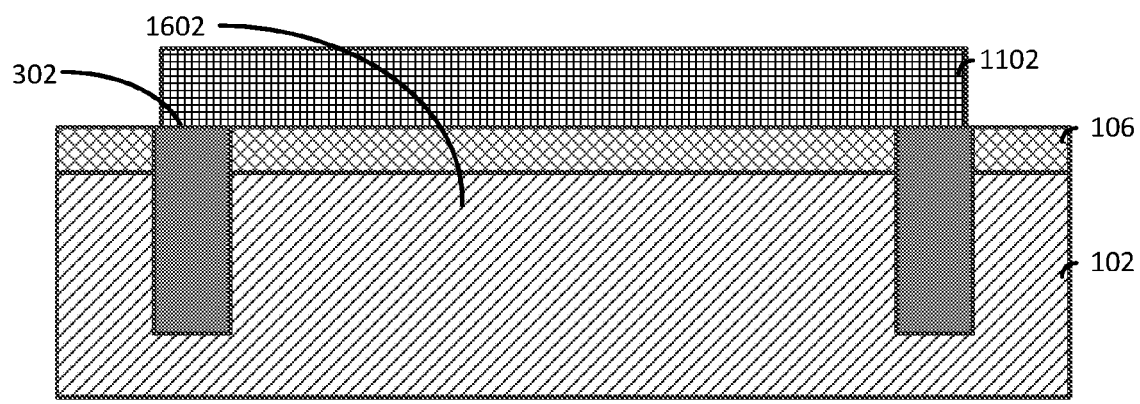

FIG. 17 illustrates a cut-away view along the line C-C (of FIG. 18) that shows the fin 1602 arranged between the shallow trench isolation regions 302.

FIG. 18 illustrates a top view of the substrate 102, the shallow trench isolation regions 302 and the second sacrificial spacers 1102.

Figure 19:

FIG. 19 illustrates a cut-away view following the removal of the shallow trench isolation regions 302 (of FIG. 18) using a suitable selective etching process. Following the removal of the shallow trench isolation regions 302, a liner layer 1902 is deposited over exposed portions of the hardmask 106, and the substrate 102. The liner layer 1902 may include, for example, a nitride material, carbon material or other suitable materials or combination of materials.

Figure 20:
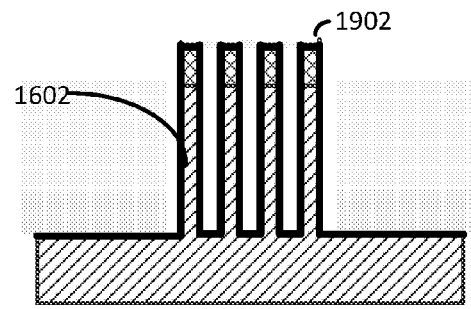
Figure 21:
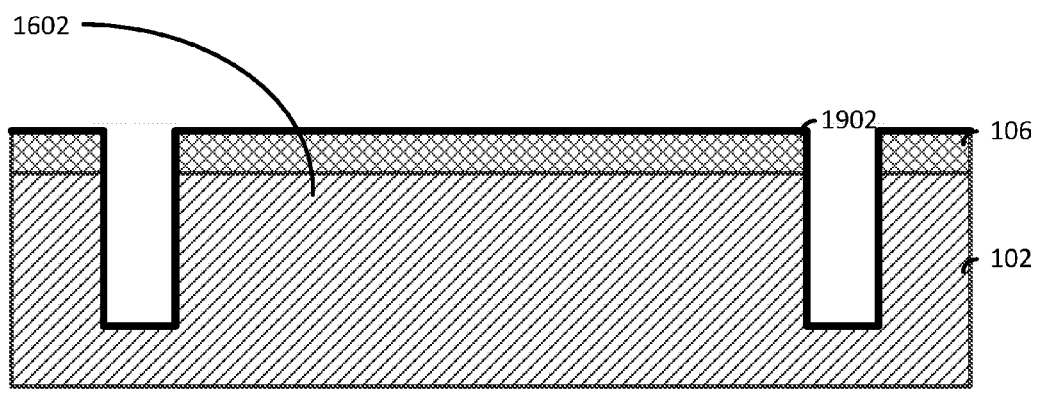

FIG. 20 illustrates a cut-away view of the fins 1602 following the deposition of the liner layer 1902. FIG. 21 illustrates another cut-away view of the fin 1602 following the deposition of the liner layer 1902.

Figure 22:
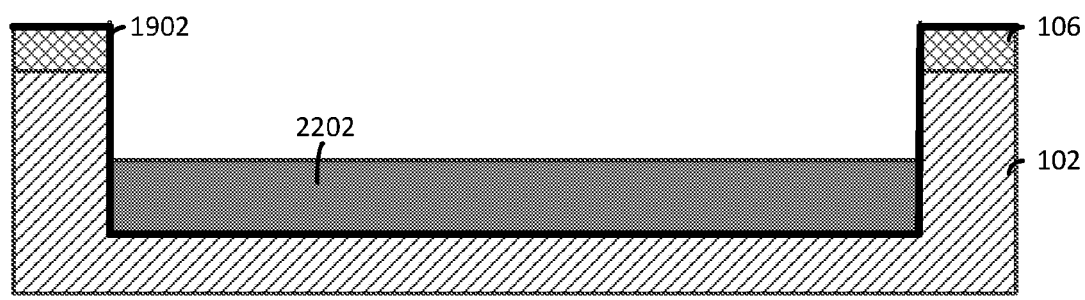
Figure 23:
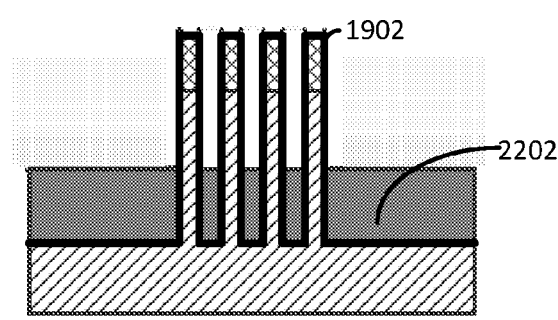
Figure 24:
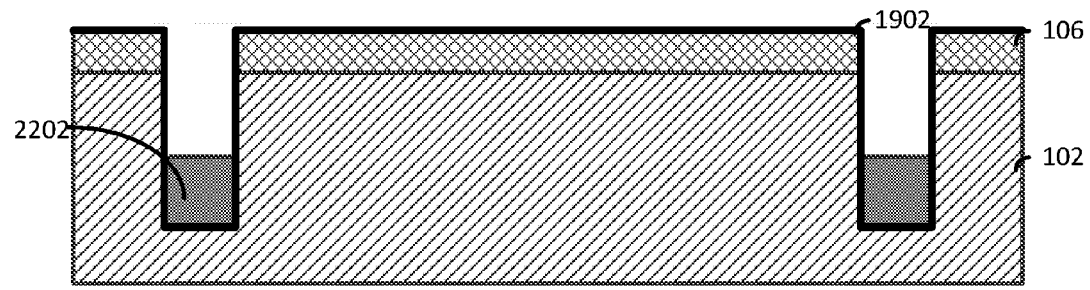

FIG. 22 illustrates a cut-away view parallel to the longitudinal axis if the fins 1602; FIG. 23 illustrates a cut-away view perpendicular to the fin 1602; and FIG. 24 illustrates a cut-away view through the fin along the longitudinal axis of the fin 1602 following the deposition of an insulator layer 2202 that forms a shallow trench isolation region over the liner layer 1902.

Figure 25:
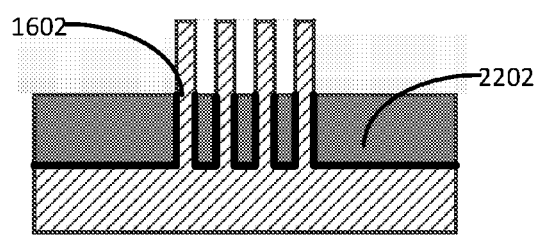

FIG. 25 illustrates a cut-away view perpendicular to the fins 1602 following the removal of the hardmask 106 and liner layer 1902 using a suitable process.

FIGS. 26-30 illustrate an alternate exemplary method for forming fins.

Figure 26:
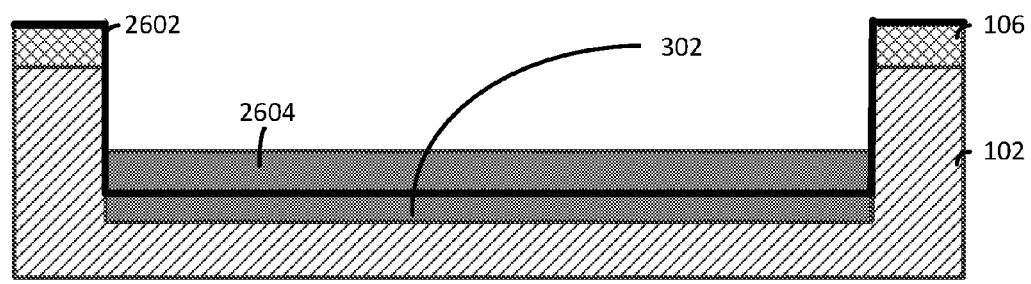
FIGS. 26-30 illustrate an alternate exemplary method for forming fins.

FIG. 26 illustrates a cut-away view parallel to the longitudinal axis if the fins 1602. FIG. 26 is similar to FIG. 19 described above however, a portion of the shallow trench isolation region 302 remains on the substrate 102. In this regard, the shallow trench isolation region 302 has not been removed as shown in FIG. 19, but rather the thickness of the shallow trench isolation region 302 has been reduced. Following the removal of portions of the shallow trench isolation region 302, a liner layer 2602 that is similar to the liner layer 1902 described above is deposited over exposed portions of the hardmask 106, the substrate 102 and the shallow trench isolation region 302. A second layer of insulator material 2602 is deposited over the liner layer 2602 over the shallow trench isolation region 302. In the illustrated exemplary embodiment, the second layer of insulator material 2602 may include, for example, an oxide material.

Figure 27:
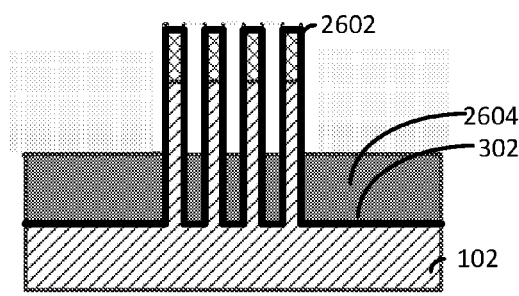
Figure 28:
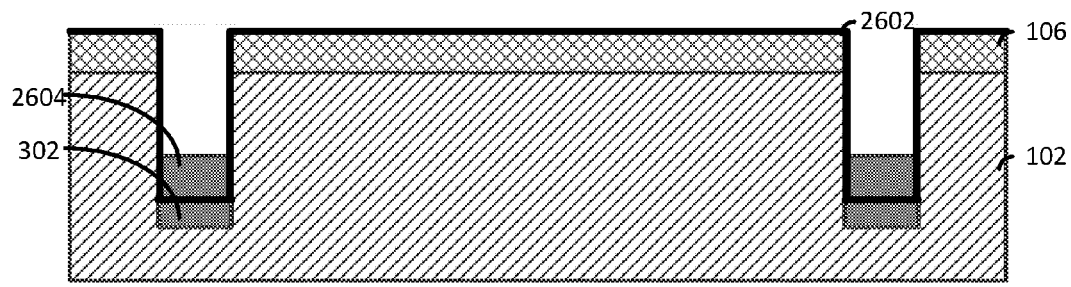

FIG. 27 illustrates a cut-away view perpendicular to the fins 1602; and FIG. 28 illustrates a cut-away view through the fin along the longitudinal axis of the fins 1602 following the deposition of the second layer of insulator material 2602 as described above.

Figure 29:
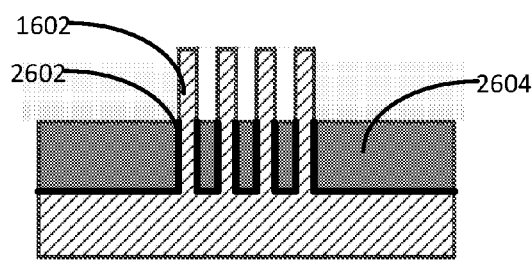

FIG. 29 illustrates a cut-away view along the line A-A (of FIG. 30) following the removal of the hardmask 106 using a suitable process.

Figure 30:
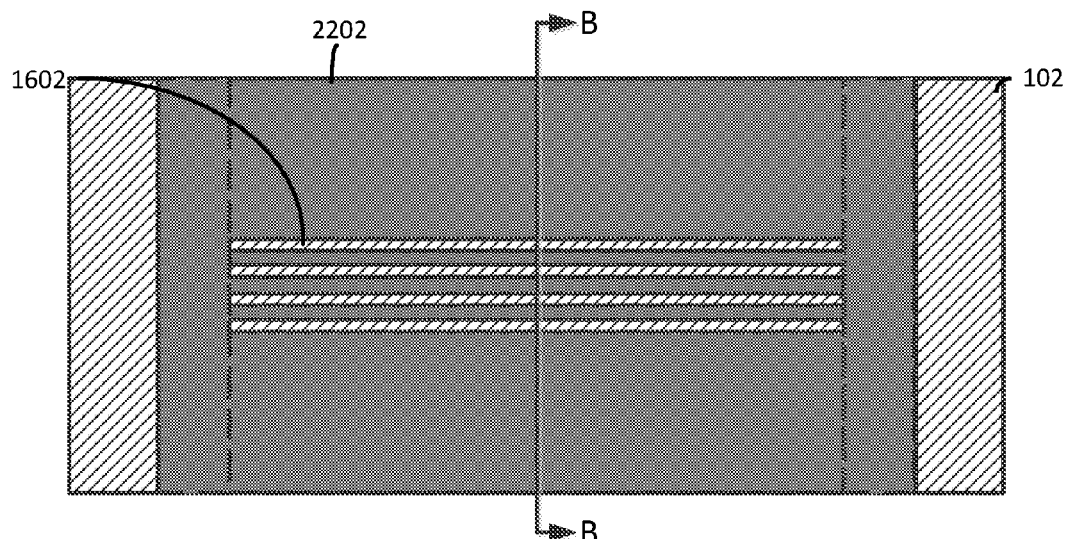

FIG. 30 illustrates a top view following the removal of the hardmask 106.

FIGS. 31-35 illustrate an exemplary method for forming a finFET device following the formation of the fins 1602 as described above in FIG. 25 or 29.

Figure 31:
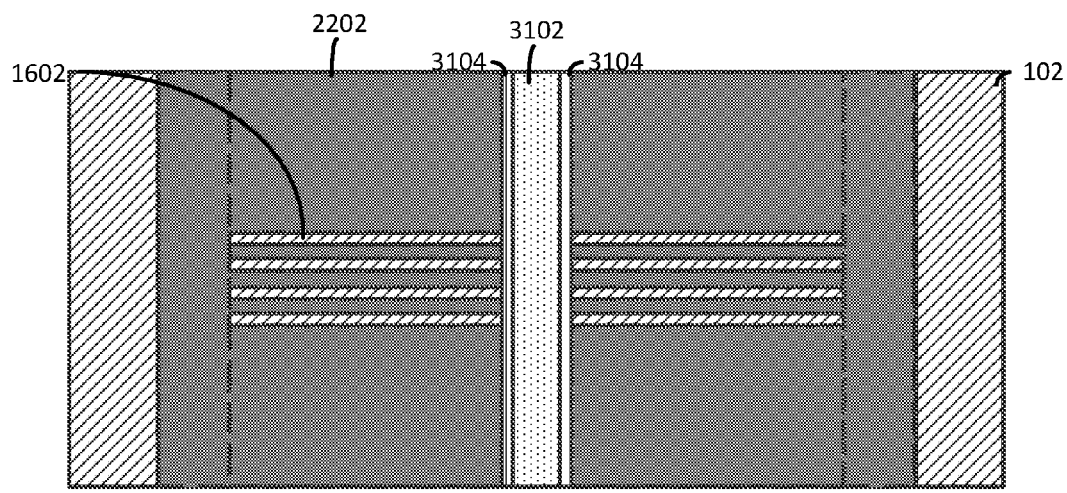
FIGS. 31-35 illustrate an exemplary method for forming a finFET device following the formation of the fins.

In this regard, FIG. 31 illustrates a top view following the formation of a sacrificial gate 3102 and spacers 3104 adjacent to the sacrificial gate 3102. The sacrificial gate 3102 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 3102 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap (not shown). The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gate 3102 and the sacrificial gate cap.

In FIG. 31, spacers 3104 are formed adjacent to the sacrificial gate 3102. The spacers 3104 in the illustrated embodiment are formed by depositing a layer of spacer material (not shown) over the exposed portions of the substrate 102, the fins 1602, and the sacrificial gate 3102. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 3104.

Figure 32:
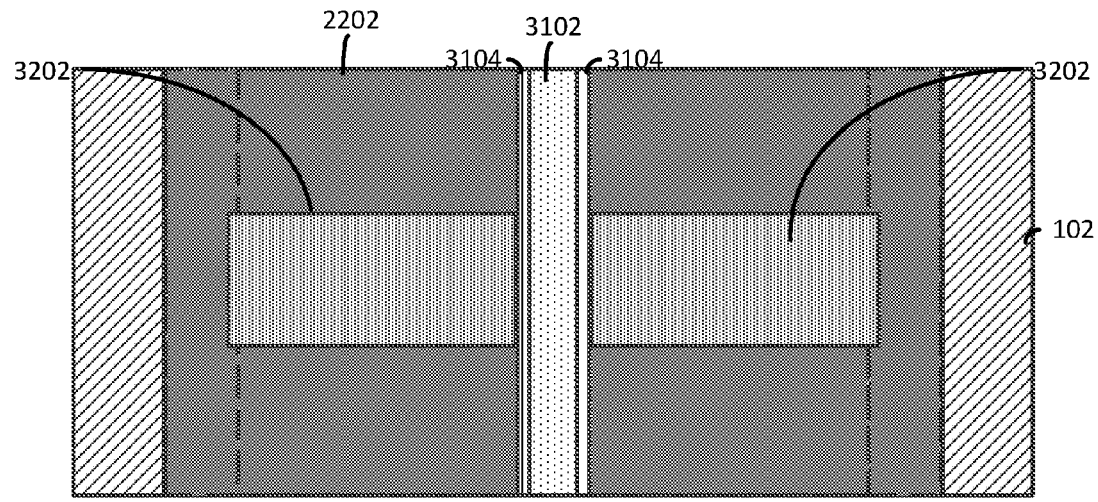

FIG. 32 illustrates a top view following the formation of source/drain regions 3202. The source/drain regions 3202 are formed by an epitaxial growth process that deposits a crystalline over layer of semiconductor material onto the exposed crystalline seed material of the exposed fin 1602 to form the source/drain regions 3202.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 33:
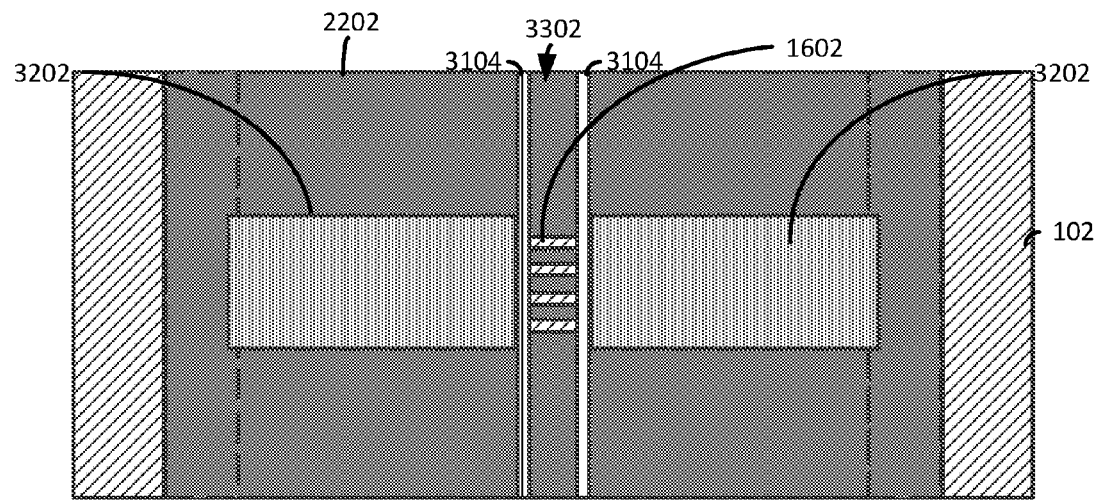

FIG. 33 illustrates a top view following the removal of the sacrificial gate 3102 (of FIG. 32) that forms a cavity 3302 that exposes channel regions of the fins 1602. The sacrificial gate 3102 may be removed by performing a dry etch process, for example, RIE, followed by a wet etch process. The wet etch process is selective to (will not substantially etch) the spacers 3104 and the inter-level dielectric material. The chemical etch process may include, but is not limited to, hot ammonia or tetramethylammonium hydroxide (TMAH).

Figure 34:
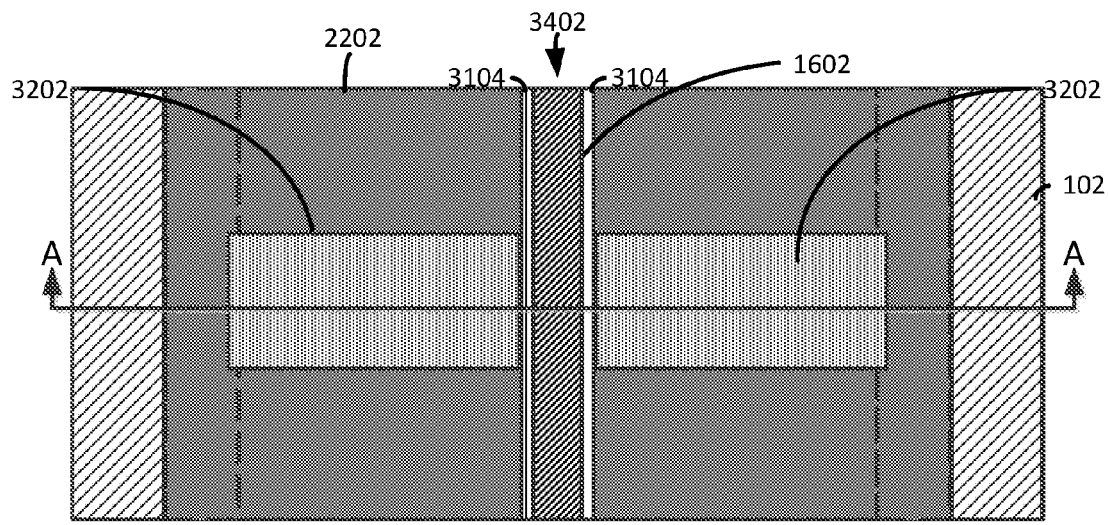

FIG. 34 illustrates a top view of the resultant structure following the formation of a replacement metal gate stack (gate stack) 3402. The gate stack 3402 include high-k metal gates formed, for example, by filling the cavity 3302 (of FIG. 33) with one or more gate dielectric 3502 materials, one or more workfunction metals 3504, and one or more metal gate conductor 3506 materials. The gate dielectric 3502 material(s) can be a dielectric material having a dielectric constant greater than 3.9, 7.0, or 10.0. Non-limiting examples of suitable materials for the dielectric 3502 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 3502 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 3504 may be disposed over the gate dielectric 3502 material. The type of work function metal(s) 3504 depends on the type of transistor and may differ between the nFET and pFET devices. Non-limiting examples of suitable work function metals 3504 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 3506 material(s) is deposited over the gate dielectric 3502 materials and work function metal(s) 3504 to form the gate stack 3402. Non-limiting examples of suitable conductive metals include aluminum (Al), platinum (Pt), gold (Au), tungsten (W), titanium (Ti), or any combination thereof. The gate conductor 3506 material(s) may be deposited by a suitable deposition process, for example, CVD, PECVD, PVD, plating, thermal or e-beam evaporation, and sputtering.

Following the deposition of the gate dielectric 3502 materials, the work function metal(s) 3504, and the gate conductor 3506 material(s), planarization process, for example, chemical mechanical planarization (CMP), is performed to remove the overburden of the deposited gate materials and form the gate stack 3402.

Figure 35:
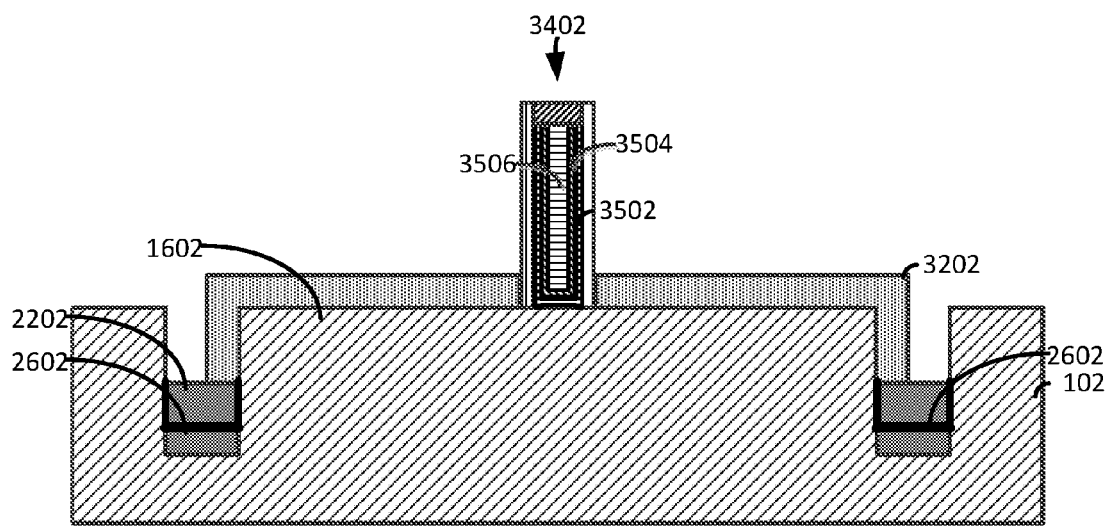

FIG. 35 illustrates a cut-away view along the line A-A (of FIG. 34) of the gate stack 3402. Following the formation of the gate stack 3402, an inter-level dielectric layer (not shown) may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer is deposited by a deposition process, including, but not limited to CVD, PVD, plasma enhanced CVD, atomic layer deposition (ALD), evaporation, chemical solution deposition, or like processes. Following the deposition of the inter-level dielectric layer, a planarization process such as, for example, chemical mechanical polishing is performed.

After the gate stack 3402 is formed, additional insulating material (not shown) may be deposited over the device(s). The insulating material may be patterned to form cavities (not shown) that expose portions of the source/drain region 3202 and the gate stack 3402. The cavities may be filled by a conductive material (not shown) and, in some embodiments, a liner layer (not shown) to form conductive contacts (not shown).

FIGS. 36-43 illustrate an alternate exemplary method for fabricating fins of a finFET device.

Figure 36:
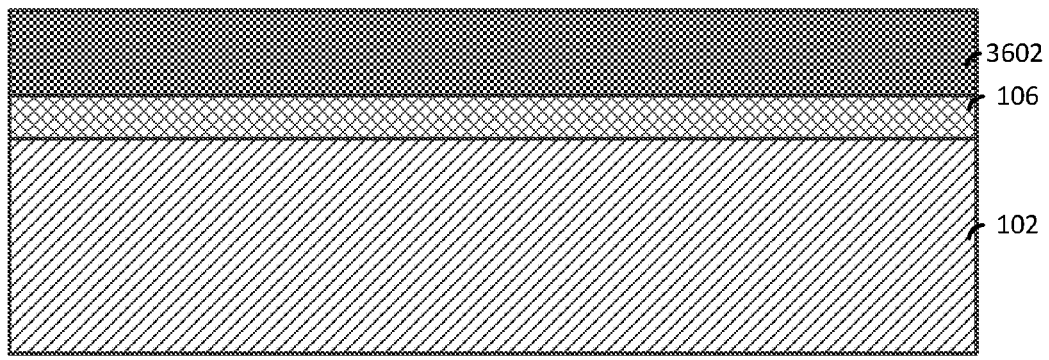
FIGS. 36-43 illustrate an alternate exemplary method for fabricating fins of a finFET device.

FIG. 36 illustrates a side view of the substrate 102 and the hardmask 106 arranged on the substrate 102. In the illustrated exemplary embodiment, a first sacrificial layer 3602 has been formed on the hardmask 106. The first sacrificial layer 3602 is similar to the first sacrificial layer 502 described above in FIG. 5.

Figure 37:
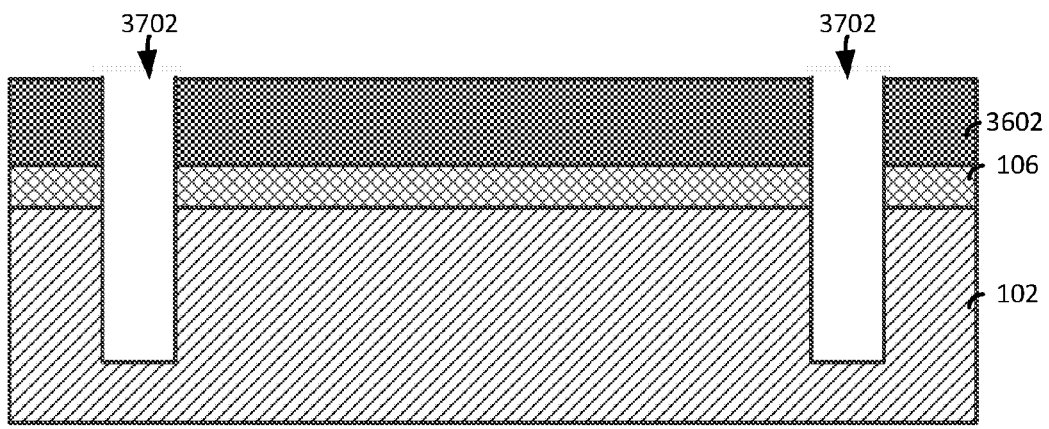

FIG. 37 illustrates a side view following a lithographic patterning and etching process such as, for example reactive ion etching that removes exposed portions of the first sacrificial layer 3602, the hardmask 106, and portions of the substrate 102 to form cavities 3702.

Figure 38:
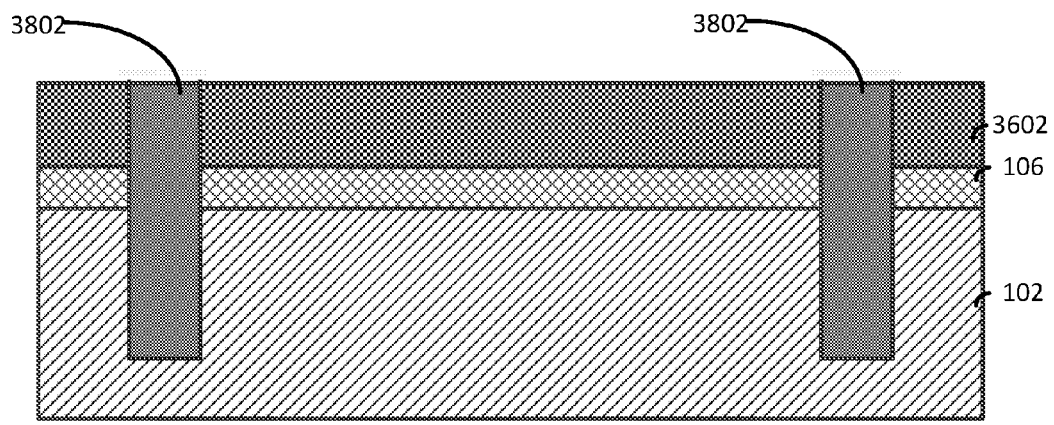

FIG. 38 illustrates a side view following the formation of shallow trench isolation regions 3802 in the cavities 3702 (of FIG. 37). The shallow trench isolation regions 3802 may be formed using a similar process as described above to form the shallow trench isolation regions 302 (of FIG. 3).

Figure 39:
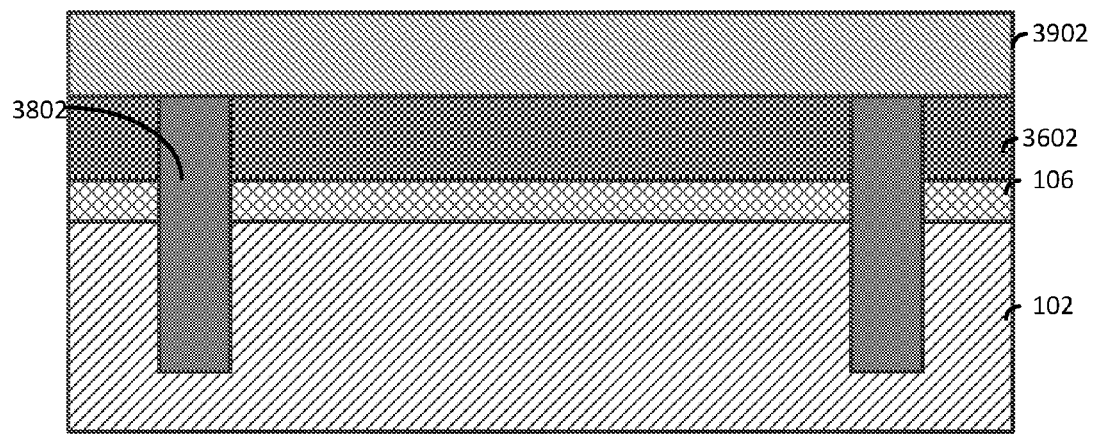

FIG. 39 illustrates a side view following the formation of a second sacrificial layer 3902 over portions of the shallow trench isolation region 3802 and the first sacrificial layer 3602.

Figure 40:
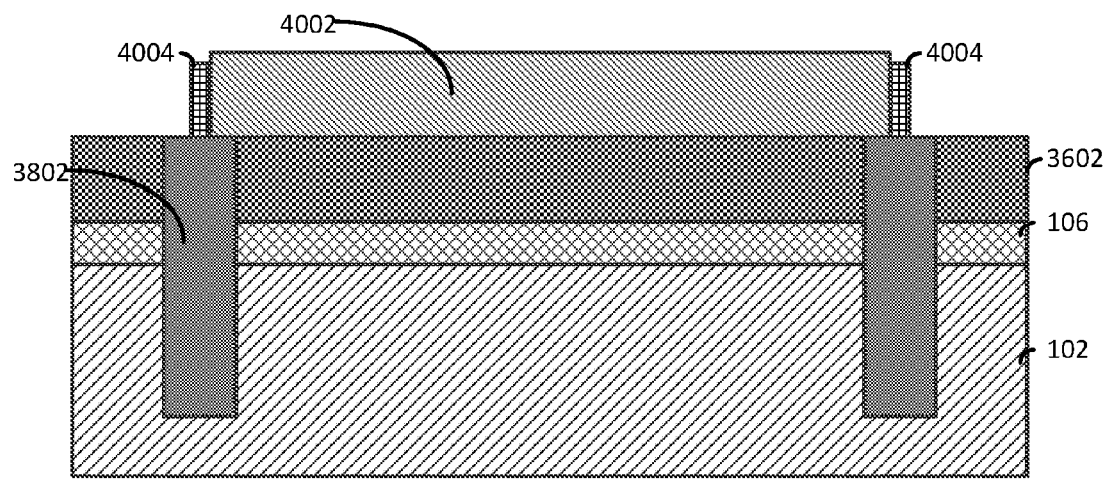

FIG. 40 illustrates a cut-away view along the line A-A (of FIG. 41) following a lithographic patterning and etching process that removes portions of the second sacrificial layer 3902 (of FIG. 39) to form a first mandrel 4002. Following the formation of the first mandrel 4002 a first sacrificial spacer 4004 is formed around the sidewalls of the first mandrel 4002 using a similar process as described above for forming the first sacrificial spacer 702 (of FIG. 7).

Figure 41:
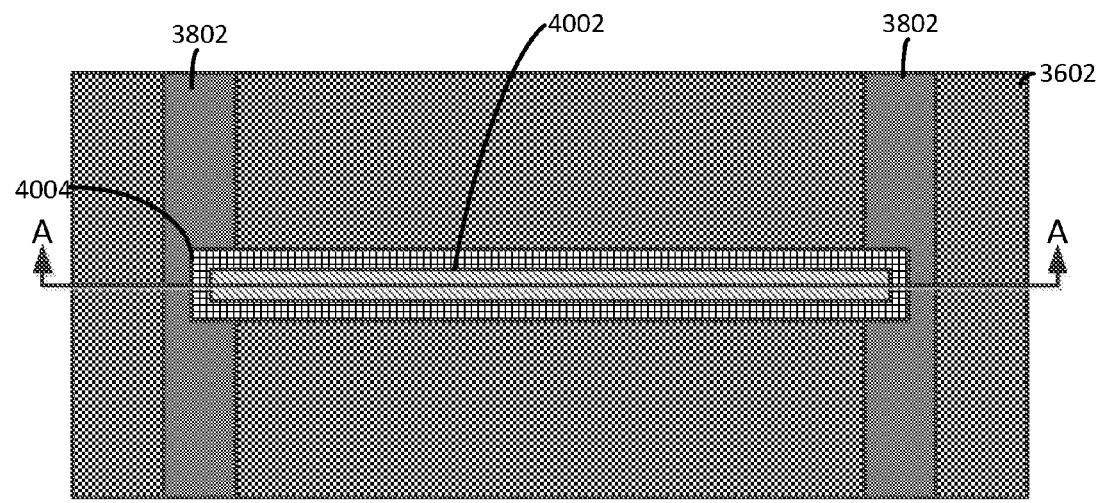

FIG. 41 illustrates a top view of the first mandrel 4002 and the first sacrificial spacer 4004 arranged on the shallow trench isolation region 3802 and the first sacrificial layer 3602.

Figure 42:
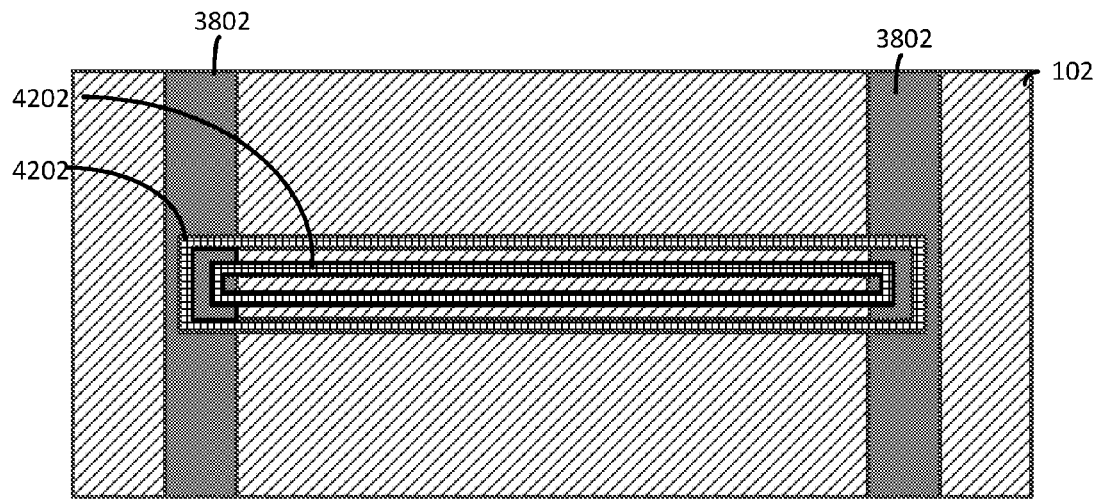
Figure 43:
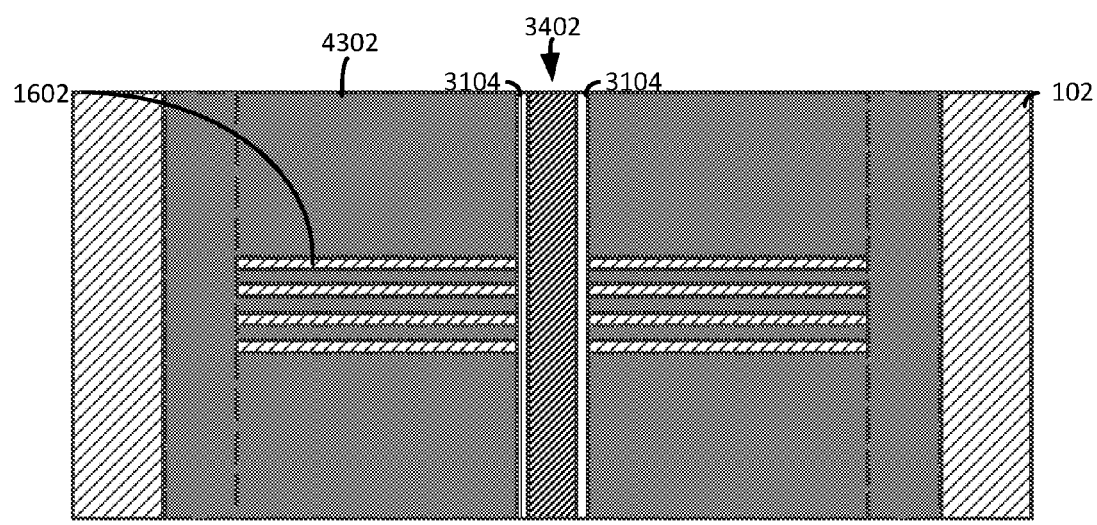

FIG. 42 illustrates a top view of the resultant structure following the formation of second sacrificial spacers 4202 and fins (shown in FIG. 43). The second sacrificial spacers 4202 are formed using a similar process as described above to form the second sacrificial spacers 1102 (of FIG. 11.) In this regard, following the removal of the first mandrel 4002 (of FIG. 41) the second sacrificial spacers 4202 are formed along the sidewalls of the first sacrificial spacers 4004 (of FIG. 40). Once the second sacrificial spacers 4202 are formed, the first sacrificial spacers 4004 may be removed. Following the removal of the first sacrificial spacers 4004, an anisotropic etching process is performed to remove exposed portions of the hardmask 106 to expose portions of the shallow trench isolation region 3802 and remove portions of the substrate 102 to form fins (described below).

FIG. 43 illustrates a top view following the removal of the second sacrificial spacers 4202 (of FIG. 42) that exposes the fins 1602. Following the exposure of the fins 1602 a shallow trench isolation region 4302 may be formed in a similar manner as described above, and a gate stack 3402 may be formed as described above to form a finFET device.

FIGS. 44-54 illustrate an alternate exemplary method for fabricating fins of a finFET device.

Figure 44:
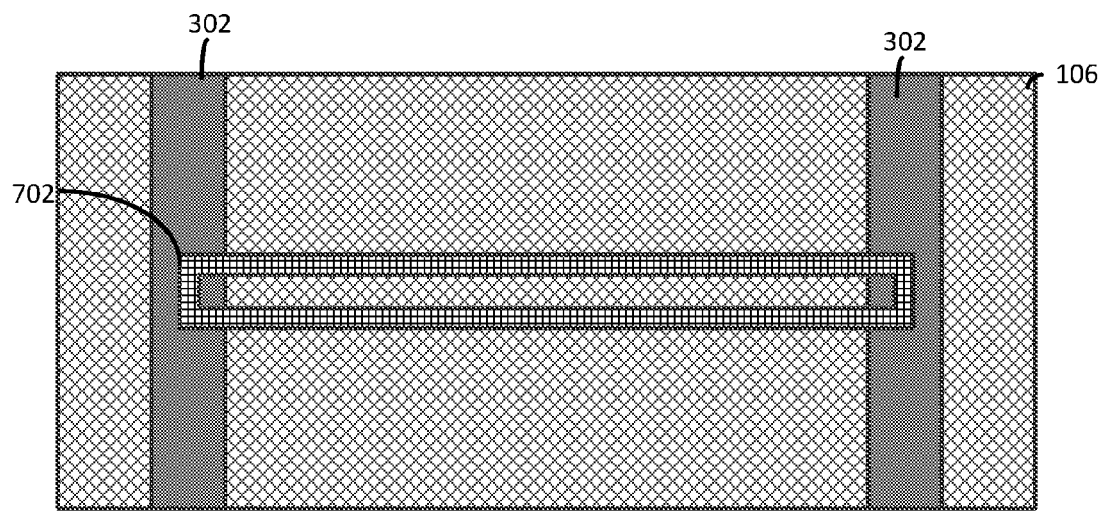
FIGS. 44-54 illustrate an alternate exemplary method for fabricating fins of a finFET device.

FIG. 44 illustrates a top view of a sacrificial spacer 702 arranged on a second sacrificial mandrel 902 (shown in FIG. 45) and trench isolation regions 302, that has been formed using a similar process as described above in FIGS. 1-10.

Figure 45:
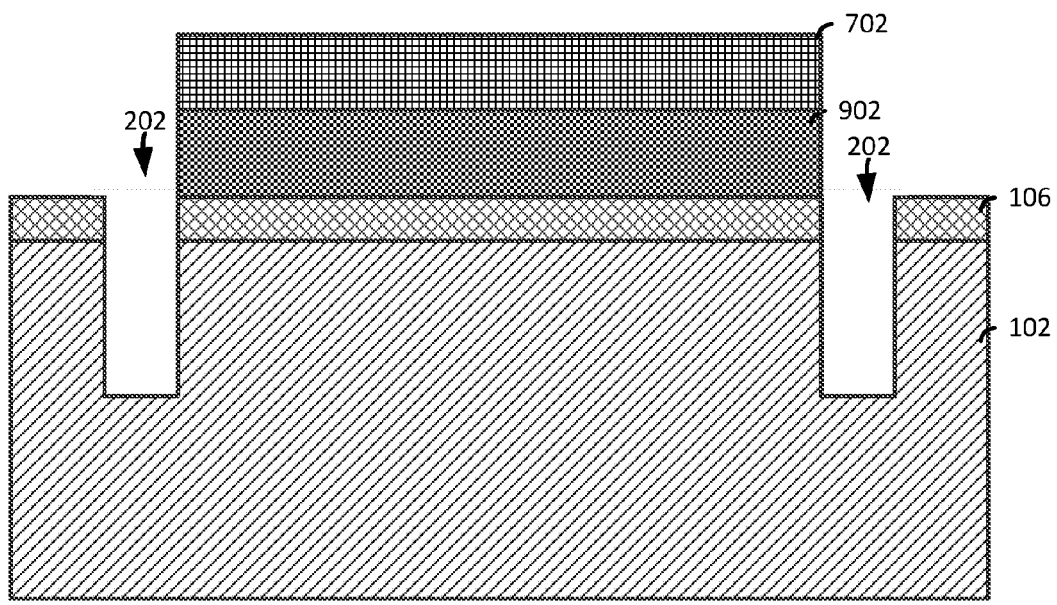
Figure 46:
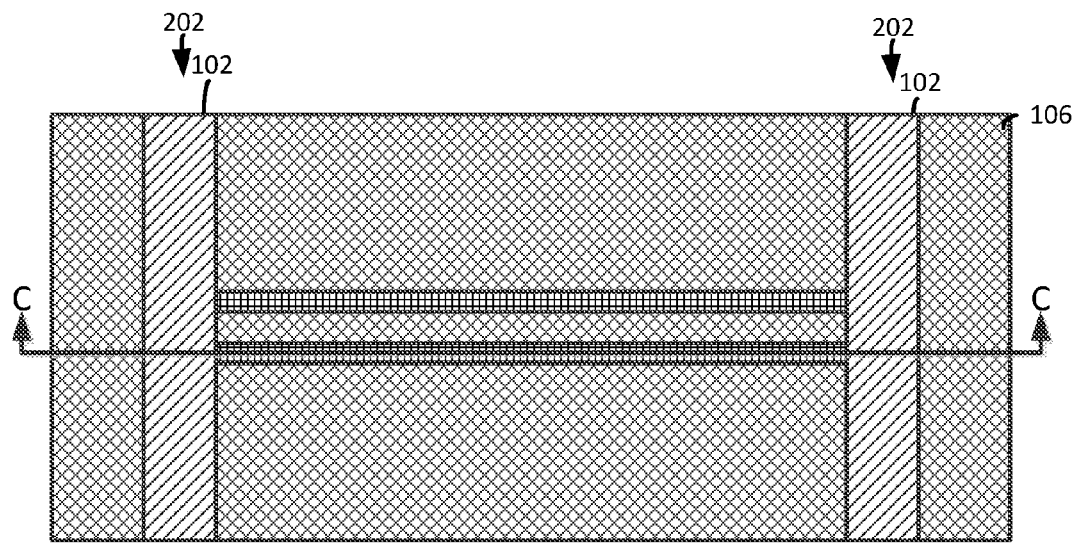

FIG. 45 illustrates a cut-away view along the line C-C (of FIG. 46) following a selective etching process that removes exposed portions of the trench isolation regions 302 to expose the cavities 202. When the trench isolation regions 302 are removed, portions of the sacrificial spacer 702 arranged on the trench isolation regions 302 are also removed. FIG. 46 illustrates a top view of the sacrificial spacer 702.

Figure 47:
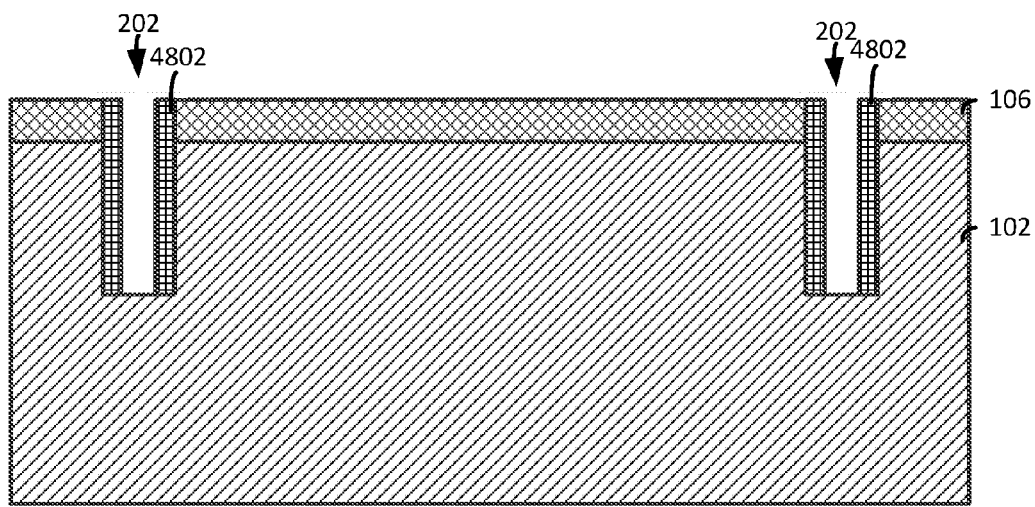
Figure 48:
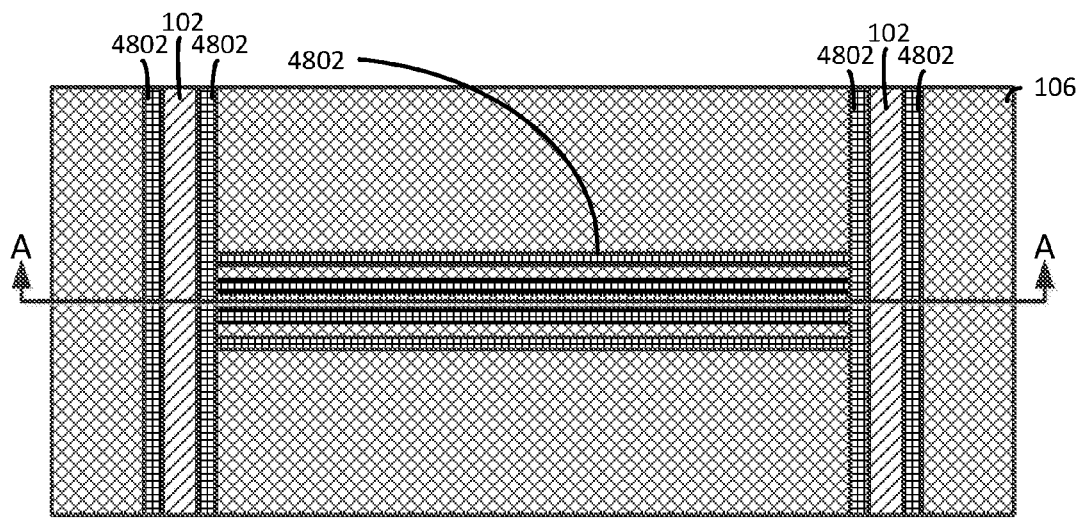

FIG. 47 illustrates a cut-away view along the line A-A (of FIG. 48) following the deposition of second sacrificial spacers 4802 that formed along sidewalls of the cavity 202. FIG. 48 illustrates a top view of the second sacrificial spacer 4802. The first sacrificial spacer 702 has been removed using a suitable selective etching process following the formation of the second sacrificial spacers 4802.

Figure 49:
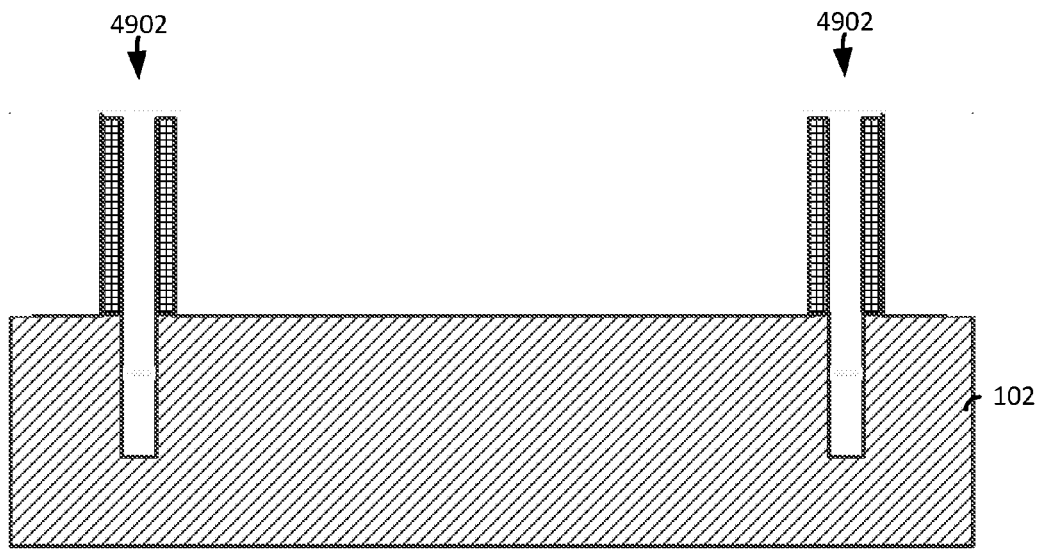
Figure 50:
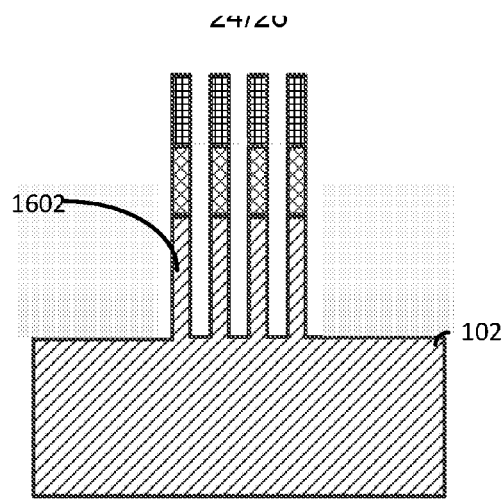
Figure 51:
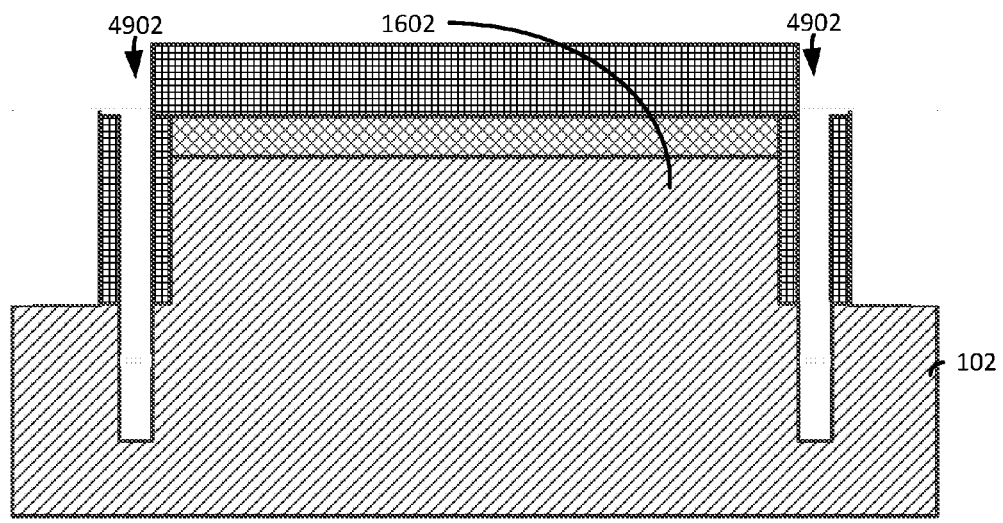
Figure 52:
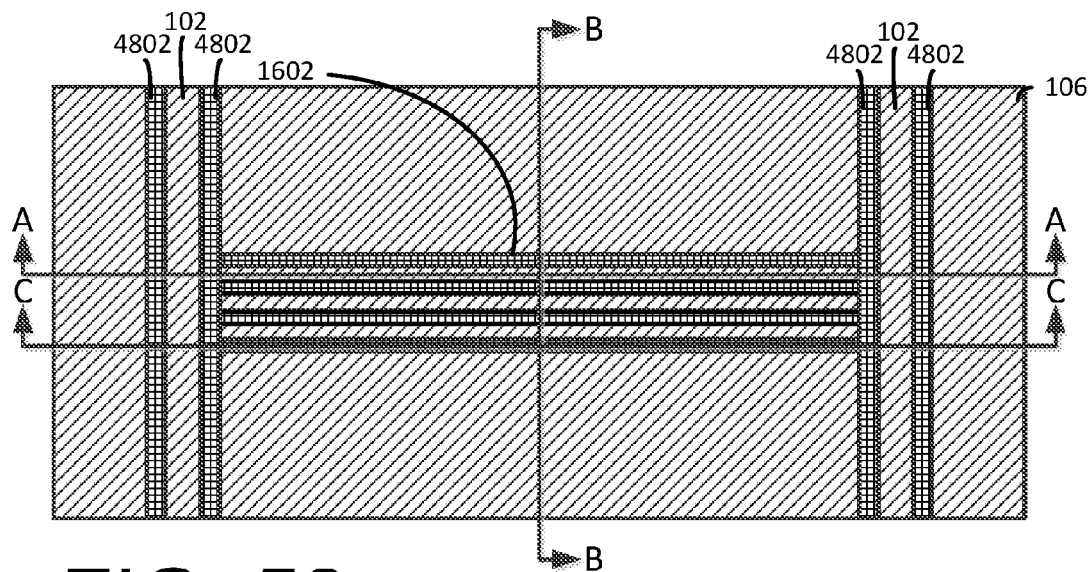

FIG. 49 illustrates a cut-away view along the line A-A (of FIG. 52) following an anisotropic etching process such as, for example, reactive ion etching that selectively removes portions of the substrate 102 to form fins 1602 (of FIG. 50) and form the cavities 4902 that increase the depth of the cavities 202 (of FIG. 47). FIG. 50 illustrates a cut-away view along the line B-B (of FIG. 52) of the fins 1602. FIG. 51 illustrates a cut-away view along the line C-C (of FIG. 52) of the fin 1602. FIG. 52 illustrates a top view of the fins 1602 arranged on the substrate.

Figure 53:
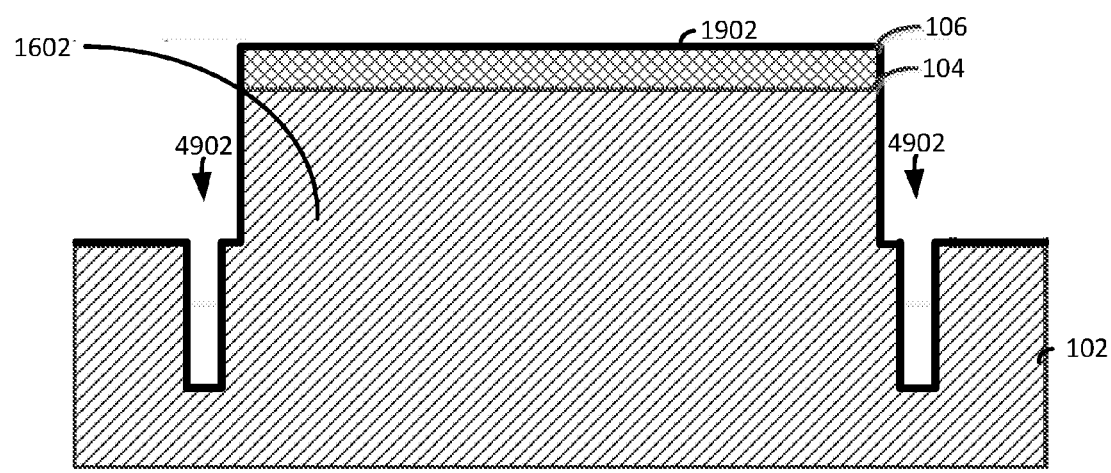

FIG. 53 illustrates a cut-away view similar to FIG. 51 of the fin 1602 following the deposition of a liner layer 1902 over exposed portions of the substrate 102 and in the cavities 4902.

Figure 54:
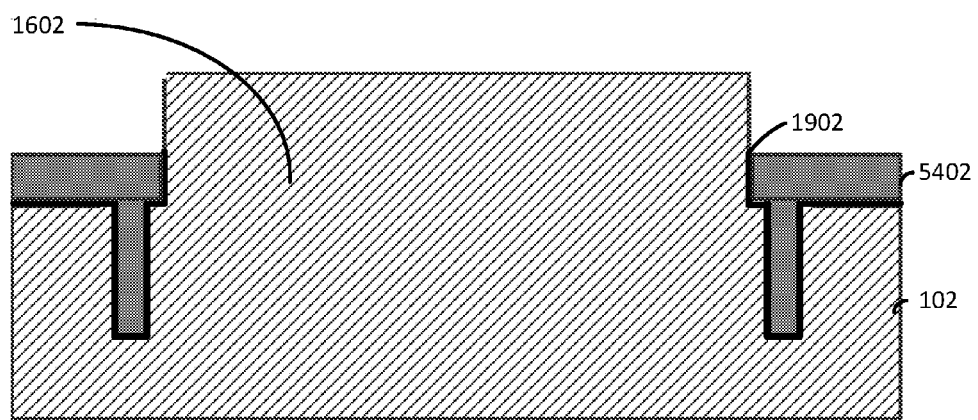

FIG. 54 illustrates a cut-away view similar to FIG. 51 of the fin 1602 following the removal of the hardmask 106 (of FIG. 53) and the deposition of an insulator material to form a shallow trench isolation region 5402 in the cavities 4902 (of FIG. 53). Following the exposure of the fins 1602 a shallow trench isolation region 4302 may be formed in a similar manner as described above, and a gate stack may be formed as described above to form a finFET device.

The methods described above form finFET devices using a sidewall image transfer process that forms fins following the formation of a trench isolation region. The methods form trench isolation regions without voids that may be caused by liner layers formed during the sidewall image transfer process.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with"

another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
    removing a portion of a substrate to form a first cavity in the substrate;
    depositing an insulator material in the first cavity;
    forming a sacrificial pattern on a portion of the insulator material in the first cavity and the substrate;
    removing exposed portions of the substrate to form a fin in the substrate; and
    forming a gate stack over a portion of the fin.

2. The method of claim 1, wherein the forming the sacrificial pattern includes:
    forming a first sacrificial layer on the substrate and the insulator material;
    forming a second sacrificial layer on the first sacrificial layer;
    removing portions of the second sacrificial layer to form a first sacrificial mandrel;
    forming a sacrificial spacer along sidewalls of the first sacrificial mandrel;
    removing the first sacrificial mandrel and exposed portions of the first sacrificial layer to form a second sacrificial mandrel; and
    forming a second sacrificial spacer along sidewalls of the second sacrificial mandrel, a portion of the second sacrificial spacer arranged on the insulator material and a portion of the second sacrificial spacer arranged on the substrate.

3. The method of claim 2, wherein the first sacrificial layer includes amorphous silicon.

4. The method of claim 2, wherein the second sacrificial layer includes amorphous carbon.

5. The method of claim 1, further comprising:
    removing a portion of the substrate to form a second cavity in the substrate; and
    depositing the insulator material in the second cavity, wherein the forming the sacrificial pattern on the portion of the insulator material in the first cavity and the substrate includes forming the sacrificial pattern on a portion of the insulator material in the second cavity.

6. The method of claim 1, further comprising:
    removing the insulator material after forming the fin in the substrate; and
    depositing an insulator material layer adjacent to the fin.

7. The method of claim 6, further comprising depositing a liner layer in the first cavity on the substrate prior to depositing the insulator material layer adjacent to the fin.

8. The method of claim 1, further comprising:
    removing the a portion of the insulator material from the first cavity to reduce a thickness of the insulator material after forming the fin in the substrate; and
    depositing an insulator material layer over the insulator material in the first cavity and over the substrate adjacent to the fin.

9. The method of claim 8, further comprising depositing a liner layer in the first cavity over the insulator material and over the substrate prior to depositing the insulator material layer.

10. The method of claim 1, wherein the substrate includes a semiconductor material.

11. The method of claim 1, further comprising depositing a hardmask on the substrate prior to forming the first cavity in the substrate.

* * * * *